(12) United States Patent
Koshimizu

(10) Patent No.: US 12,300,465 B2
(45) Date of Patent: May 13, 2025

(54) PLASMA PROCESSING APPARATUS

(71) Applicant: Tokyo Electron Limited, Tokyo (JP)

(72) Inventor: Chishio Koshimizu, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 289 days.

(21) Appl. No.: 17/828,103

(22) Filed: May 31, 2022

(65) Prior Publication Data

US 2022/0384150 A1 Dec. 1, 2022

(30) Foreign Application Priority Data

May 31, 2021 (JP) .................................. 2021-091015
May 26, 2022 (JP) .................................. 2022-086242

(51) Int. Cl.
*H01J 37/32* (2006.01)

(52) U.S. Cl.
CPC .. *H01J 37/32183* (2013.01); *H01J 37/32541* (2013.01); *H01J 37/32642* (2013.01); *H01J 37/32715* (2013.01)

(58) Field of Classification Search
CPC .......... H01J 37/32082; H01J 37/32091; H01J 37/32532; H01J 37/32568; H01J 37/32165; H01J 37/32642; H01J 37/32183; H01J 37/32541; H01J 37/32715; H01J 37/32137; H01J 37/32174; H01J 37/32146; H01J 15/00; H01J 37/3244; H01J 37/32623; H01J 37/32009; H01J 37/32018; H01J 37/32027; H01J 37/32036; H01L 21/6831; H01L 21/6833; H01L 21/67069; C23C 16/509; C23C 16/505; C23C 16/507; C23C 16/5096; C23C 16/45565
(Continued)

(56) References Cited

U.S. PATENT DOCUMENTS 11,664,200 B2 * 5/2023 Sasaki ............... H01J 37/32522
361/234
11,923,171 B2 * 3/2024 Sasaki ............... H01L 21/31144
(Continued)

FOREIGN PATENT DOCUMENTS

JP 2008-227063 A 9/2008
JP 2011035266 A * 2/2011 ........ H01J 37/32091

OTHER PUBLICATIONS

Machine Translation for JP 2011-035266 A (Year: 2024).*

*Primary Examiner* — Rudy Zervigon
(74) *Attorney, Agent, or Firm* — XSENSUS LLP

(57) ABSTRACT

A plasma processing apparatus includes a plasma processing chamber, a substrate support including a bias electrode, an RF power source configured to generate RF power to generate plasma in the plasma processing chamber, an edge ring disposed to surround a substrate on the substrate support, a ring electrode disposed to surround the edge ring, a first bias RF power source and a second bias RF power source. The first bias RF power source is configured to supply a first bias RF power to the bias electrode, the first bias RF power having a first frequency and a first power level. The second bias RF power source is configured to supply a second bias RF power to the ring electrode, the second bias RF power having the first frequency and a second power level and the second bias RF power being synchronized with the first bias RF power.

7 Claims, 14 Drawing Sheets

(58) Field of Classification Search
USPC ............ 156/345.43, 345.44, 345.45, 345.46, 156/345.47; 118/723 E, 723 ER
See application file for complete search history.

(56) References Cited

U.S. PATENT DOCUMENTS

2010/0243606 A1* 9/2010 Koshimizu ....... H01J 37/32091
156/345.44
2020/0266088 A1* 8/2020 Kosakai ............ H01L 21/76826

* cited by examiner

PLASMA PROCESSING APPARATUS

CROSS-REFERENCE TO RELATED APPLICATIONS

This application claims priority to Japanese Patent Application Nos. 2021-091015 and 2022-086242, respectively filed on May 31, 2021 and May 26, 2022, the entire contents of each are incorporated herein by reference.

TECHNICAL FIELD

Exemplary embodiments of the present disclosure relate to a plasma processing apparatus and a plasma processing method.

BACKGROUND

A plasma processing apparatus is used for performing plasma processing on a substrate. The plasma processing apparatus includes a chamber, an electrostatic chuck, and a lower electrode. The electrostatic chuck and lower electrode are provided in the chamber. The electrostatic chuck is provided on the lower electrode. The electrostatic chuck supports an edge ring mounted thereon. The edge ring may be called a focus ring. The electrostatic chuck supports a substrate disposed in a region surrounded by the edge ring. When plasma processing is performed in a plasma processing apparatus, a gas is supplied into the chamber. In addition, radio frequency power is supplied to the lower electrode. Plasma is formed from the gas in the chamber. The substrate is processed by chemical species such as ions and radicals in the plasma.

When the plasma processing is performed, the edge ring is worn, and a thickness of the edge ring decreases. When the thickness of the edge ring decreases, a position of an upper end of a plasma sheath (hereinafter referred to as "sheath") above the edge ring becomes lower. A position of the upper end of the sheath above the edge ring in a vertical direction and a position of the upper end of the sheath above the substrate in a vertical direction should be identical. Japanese Laid-open Patent Publication No. 2008-227063 (hereinafter referred to as "Patent Document 1") discloses a plasma processing apparatus capable of adjusting the position of the upper end of the sheath above the edge ring in the vertical direction. The plasma processing apparatus described in Patent Document 1 is configured to apply a DC voltage to the edge ring. Further, the plasma processing apparatus described in Patent Document 1 is configured to adjust a power level of radio frequency power supplied to the lower electrode when a DC voltage is applied to the edge ring.

SUMMARY

The present disclosure provides a technique for suppressing fluctuations in spread of plasma in a radial direction during a period of electrical bias energy supplied to a bias electrode of a substrate support of a plasma processing apparatus.

One exemplary embodiment provides a plasma processing apparatus. The plasma processing apparatus includes a plasma processing chamber, a substrate support, an RF power source, an edge ring, a ring electrode, a first bias RF power source and a second bias RF power source. The substrate support is disposed in the plasma processing chamber and includes a bias electrode. The RF power source is configured to generate RF power to generate plasma in the plasma processing chamber. The edge ring is disposed to surround a substrate on the substrate support. The ring electrode is disposed to surround the edge ring. The first bias RF power source is configured to supply a first bias RF power to the bias electrode. The first bias RF power has a first frequency and a first power level. The second bias RF power source is configured to supply a second bias RF power to the ring electrode. The second bias RF power has the first frequency and a second power level. The second bias RF power is synchronized with the first bias RF power.

DETAILED DESCRIPTION

Figure 1:
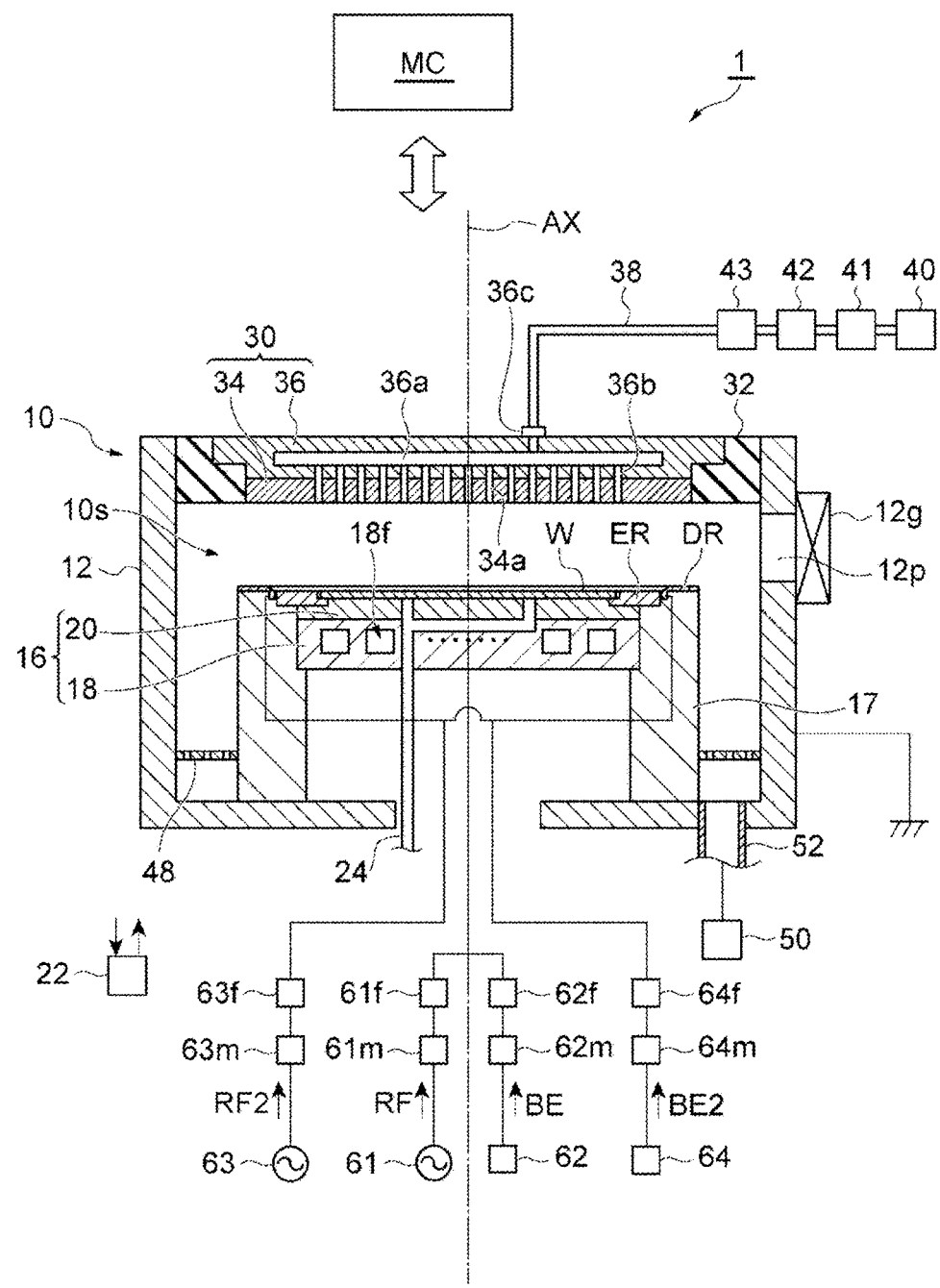
FIG. 1 is a diagram schematically showing a plasma processing apparatus according to one exemplary embodiment.

Hereinafter, various exemplary embodiments will be described in detail with reference to the drawings. In addition, the same reference numerals are given to the same or corresponding parts in each of the drawings.

Figure 2:
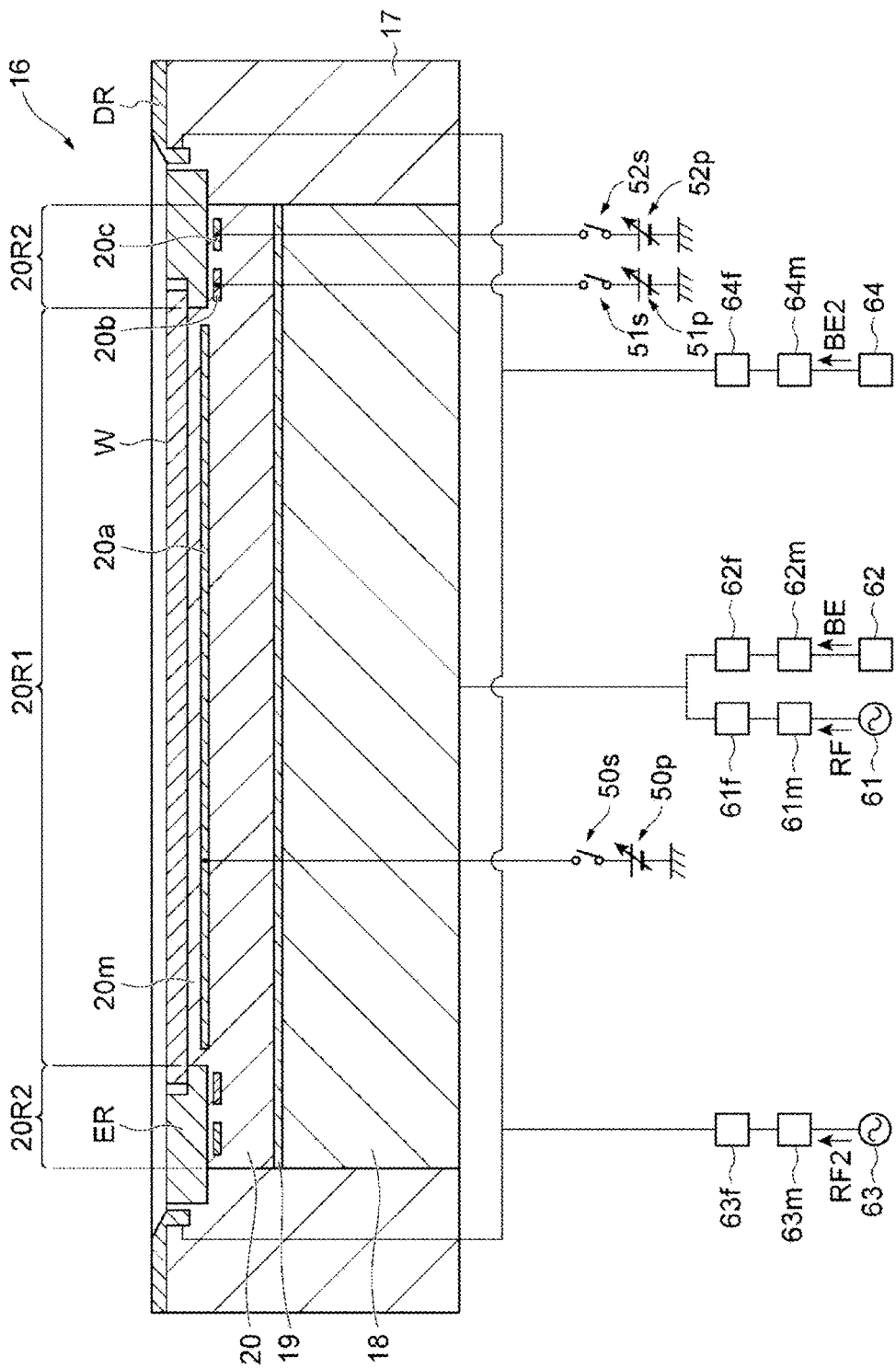
FIG. 2 is a diagram showing a substrate support and a plurality of power supplies in the plasma processing apparatus according to one exemplary embodiment.

FIG. 1 is a diagram schematically showing a plasma processing apparatus according to one exemplary embodiment. FIG. 2 is a diagram showing a substrate support and a plurality of power supplies of the plasma processing apparatus according to one exemplary embodiment. The plasma processing apparatus 1 shown in FIG. 1 is a capacitive coupling type plasma processing apparatus. The plasma processing apparatus 1 includes a chamber 10 (plasma processing chamber). The chamber 10 provides an internal space 10s therein. A central axis of the internal space 10s is an axis AX that extends in a vertical direction.

In one embodiment, the chamber 10 may include a chamber body 12. The chamber body 12 has a substantially cylindrical shape. The internal space 10s is provided in the chamber body 12. The chamber body 12 is made of, for example, aluminum. The chamber body 12 is electrically grounded. A plasma-resistant film is formed on an inner wall surface of the chamber body 12, that is, a wall surface that defines the internal space 10s. This film can be a ceramic film, such as a film formed by anodizing or a film formed from yttrium oxide.

A side wall of the chamber body 12 provides a passage 12p. The substrate W passes through the passage 12p when the substrate is transferred between the internal space 10s and the outside of the chamber 10. A gate valve 12g is provided along the side wall of the chamber body 12 to open or close the passage 12p.

As shown in FIGS. 1 and 2, the plasma processing apparatus 1 further includes a substrate support 16. The substrate support 16 is surrounded by a dielectric part 17. The dielectric part 17 is provided at the radial outer side of the substrate support 16 with respect to the axis AX and extends in a circumferential direction. The dielectric part 17 is formed of a dielectric such as quartz. The dielectric part 17 may support the substrate support 16.

The substrate support 16 is configured to support the substrate W mounted thereon in the chamber 10. The substrate W has substantially a disk shape. The substrate W is mounted on the substrate support 16 so that a center thereof is located on the axis AX. The substrate support 16 is configured to further support an edge ring ER. The edge ring ER has a ring shape. The edge ring ER is formed of a material selected according to a plasma processing performed in the plasma processing apparatus 1. The edge ring ER is formed of, for example, silicon or silicon carbide. The edge ring ER is mounted on the substrate support 16 so that a central axis thereof coincides with the axis AX. The substrate W is disposed on the substrate support 16 and disposed in a region surrounded by the edge ring ER. That is, the edge ring ER is disposed to surround the substrate W. An outer edge portion of the edge ring ER may be mounted on the dielectric part 17.

The substrate support 16 may include a base 18 and an electrostatic chuck 20. The base 18 and the electrostatic chuck 20 are provided in the chamber 10. The base 18 is formed of a conductive material such as aluminum and has substantially a disk shape. A central axis of the base 18 is the axis AX.

A flow path 18f is provided in the base 18. The flow path 18f is a flow path for a heat exchange medium. The heat exchange medium is, for example, a refrigerant. The flow path 18f is connected to a supply device 22 for the heat exchange medium. The supply device 22 is provided outside the chamber 10. The flow path 18f receives the heat exchange medium supplied from the supply device 22. The heat exchange medium supplied to the flow path 18f is returned to the supply device 22.

The electrostatic chuck 20 is provided on the base 18. The electrostatic chuck 20 may be fixed to the base 18 via a joining member 19 such as an adhesive. The electrostatic chuck 20 includes a first region 20R1 and a second region 20R2. The first region 20R1 is a region for holding the substrate W mounted thereon and has substantially a disk shape. A central axis of the first region 20R1 substantially coincides with the axis AX. The second region 20R2 is a region for holding the edge ring ER mounted thereon. The second region 20R2 has a substantially annular shape in a plan view. The second region 20R2 is provided at the radial outer side of the first region 20R1 and extends in the circumferential direction. An upper surface of the first region 20R1 extends at a position higher than a position of an upper surface of the second region 20R2 in the height direction.

The electrostatic chuck 20 has a main body 20m and a chuck electrode 20a. The main body 20m is formed of a dielectric such as aluminum oxide or aluminum nitride. The main body 20m has substantially a disk shape. A central axis of the electrostatic chuck 20 and the main body 20m is the axis AX. The chuck electrode 20a is provided in the main body 20m in the first region 20R1. The chuck electrode 20a is a film formed of a conductive material. The chuck electrode 20a may have a substantially circular planar shape. The center of the chuck electrode 20a may be located on the axis AX. The chuck electrode 20a is electrically connected to a DC power source 50p via a switch 50s. When a voltage from the DC power source 50p is applied to the chuck electrode 20a, electrostatic attraction force is generated between the electrostatic chuck 20 and the substrate W. Due to the generated electrostatic attraction force, the substrate W is attracted to the electrostatic chuck 20 and is held by the electrostatic chuck 20.

The electrostatic chuck 20 may further have chuck electrodes 20b and 20c. The chuck electrodes 20b and 20c are provided in the main body 20m in the second region 20R2. Each of the chuck electrodes 20b and 20c is a film formed of a conductive material. The chuck electrodes 20b and 20c extend around the axis AX in the circumferential direction. The chuck electrode 20c is provided and extends at the radial outer side of the chuck electrode 20b. Each of the chuck electrodes 20b and 20c may have a ring shape. The chuck electrode 20b is electrically connected to a DC power source 51p via a switch 51s. The chuck electrode 20c is electrically connected to a DC power source 52p via a switch 52s. When a voltage from the DC power source 51p and a voltage from the DC power source 52p are applied to the chuck electrodes 20b and 20c, respectively, electrostatic attraction force is generated between the electrostatic chuck 20 and the edge ring ER. Due to the generated electrostatic attraction force, the edge ring ER is attracted to the electrostatic chuck 20 and held by the electrostatic chuck 20.

The plasma processing apparatus 1 further includes a ring electrode DR. The ring electrode DR is provided and extends at the radial outer side of the edge ring ER. The ring electrode DR may have substantially a ring shape in a plan view. In the embodiment of FIG. 2, the ring electrode DR extends to surround the edge ring ER. The ring electrode DR may be disposed on the dielectric part 17. In the embodiment of FIG. 2, the ring electrode DR is formed of a conductive material such as silicon, silicon carbide, nickel, Hastelloy, or the like.

As shown in FIG. 1, the plasma processing apparatus 1 may provide a gas supply line 24. The gas supply line 24 supplies a heat transfer gas from a gas supply mechanism, for example, He gas, to a gap between an upper surface of the electrostatic chuck 20 and a back surface (a lower surface) of the substrate W.

The plasma processing apparatus 1 further includes an upper electrode 30. The upper electrode 30 is provided above the substrate support 16. The upper electrode 30 closes an upper opening of the chamber body 12 together with a member 32. The member 32 has an insulating property. The upper electrode 30 is supported on an upper portion of the chamber body 12 via the member 32.

The upper electrode 30 may include a top plate 34 and a support 36. A lower surface of the top plate 34 defines the internal space 10s. The top plate 34 provides a plurality of gas holes 34a. Each of the plurality of gas holes 34a passes through the top plate 34 in a thickness direction (a vertical direction). The top plate 34 is made of, for example, silicon. Alternatively, the top plate 34 may have a structure in which a plasma resistant film is provided on a surface of an aluminum member. This film can be a ceramic film, such as a film formed by anodizing or a film formed from yttrium oxide.

The support 36 supports the top plate 34 in a detachable manner. The support 36 is made of a conductive material such as aluminum. A gas diffusion chamber 36a is provided in the support 36. A plurality of gas holes 36b are further provided in the support 36. The plurality of gas holes 36b extend downward from the gas diffusion chamber 36a and are in communication with each of the plurality of gas holes 34a. The support 36 further provides a gas introduction port 36c. The gas introduction port 36c is connected to the gas diffusion chamber 36a. A gas supply pipe 38 is connected to the gas introduction port 36c.

A gas source group 40 is connected to the gas supply pipe 38 via a valve group 41, a flow rate controller group 42, and a valve group 43. The gas source group 40, the valve group 41, the flow rate controller group 42, and the valve group 43 constitute a gas supply. The gas source group 40 includes a plurality of gas sources. Each of the valve group 41 and the valve group 43 includes a plurality of valves (for example, on-off valves). The flow rate controller group 42 includes a plurality of flow rate controllers. Each of the plurality of flow rate controllers of the flow rate controller group 42 is a mass flow controller or a pressure control type flow rate controller. Each of the plurality of gas sources of the gas source group 40 is connected to the gas supply pipe 38 via a corresponding valve of the valve group 41, a corresponding flow rate controller of the flow rate controller group 42, and a corresponding valve of the valve group 43. The plasma processing apparatus 1 can supply a gas from one or more gas sources selected from the plurality of gas sources of the gas source group 40 to the internal space 10s at an individually adjusted flow rate.

The plasma processing apparatus 1 may further include a baffle member 48. The baffle member 48 extends between the dielectric part 17 and the side wall of the chamber body 12. The baffle member 48 may be configured, for example, by coating an aluminum member with a ceramic such as yttrium oxide. The baffle member 48 provides a plurality of through holes. A space above the baffle member 48 and a space below the baffle member 48 are connected via the plurality of through holes of the baffle member 48.

The plasma processing apparatus 1 may further include an exhaust device 50. The exhaust device 50 is connected to a bottom portion of the chamber body 12 below the baffle member 48 via an exhaust pipe 52. The exhaust device 50 has a pressure controller such as an automatic pressure control valve and a vacuum pump such as a turbo molecular pump and can reduce a pressure in the internal space 10s.

As shown in FIGS. 1 and 2, the plasma processing apparatus 1 further includes a radio frequency power source 61 (RF power source). The radio frequency power source 61 generates radio frequency power RF (RF power) supplied to a radio frequency electrode to generate plasma above the substrate support 16. The radio frequency power RF has a frequency in a range of 27 to 100 MHz, for example a frequency of 40 MHz or 60 MHz. In one embodiment, the radio frequency electrode is the base 18. That is, in one embodiment, the base 18 provides a lower electrode which is the radio frequency electrode.

The radio frequency power source 61 is connected to the base 18 via a matcher 61m. The matcher 61m has a matching circuit configured to match impedance on the load side (the base 18 side) of the radio frequency power source 61 with output impedance of the radio frequency power source 61. In one embodiment, the radio frequency power source 61 may be connected to the base 18 via the matcher 61m and a filter 61f. The filter 61f is a filter having a frequency characteristic for selectively passing the radio frequency power RF and has a characteristic for blocking or reducing electrical bias energy which will be described below. The radio frequency power source 61 may be electrically connected to the upper electrode 30 instead of the radio frequency electrode of the substrate support 16. That is, in another embodiment, the radio frequency electrode may be the upper electrode 30.

The plasma processing apparatus 1 further includes a bias power source 62 (a first bias power source). The bias power source 62 is electrically coupled to a bias electrode of the substrate support 16 and is configured to generate electrical bias energy BE applied to the bias electrode of the substrate support 16. In the embodiment of FIG. 2, the bias electrode of the substrate support 16 is the base 18. The electrical bias energy BE is used to attract ions into the substrate W. The electrical bias energy BE has a bias frequency. The bias frequency may be different from or the same as a frequency of the radio frequency power RF. The bias frequency may be lower than the frequency of the radio frequency power RF. In one embodiment, the bias frequency is a frequency in a range of 50 kHz to 27 MHz, for example 400 kHz.

Figure 3A:
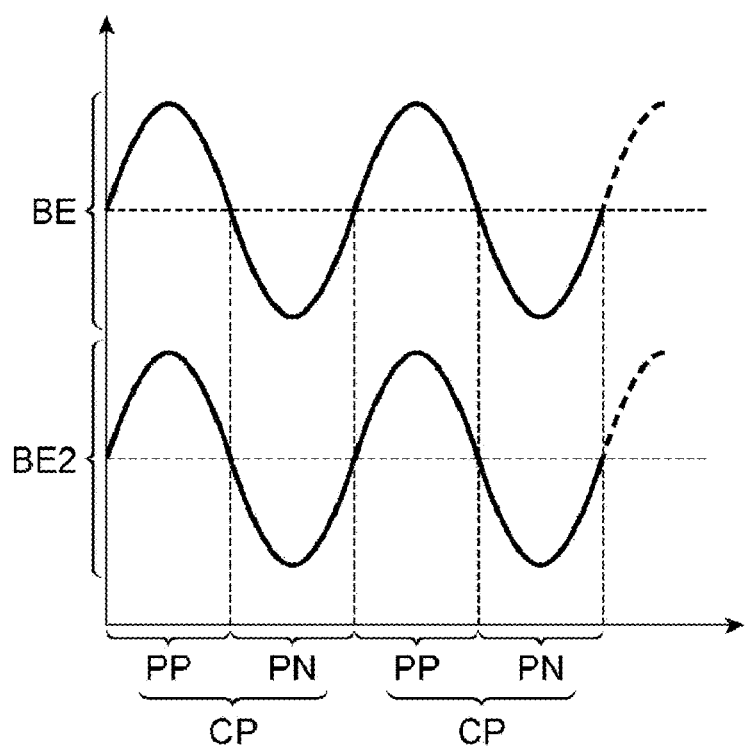
FIGS. 3A and 3B are diagrams showing an example of electrical bias energy supplied to a bias electrode and an example of electrical bias energy supplied to a ring electrode, respectively.
Figure 3B:
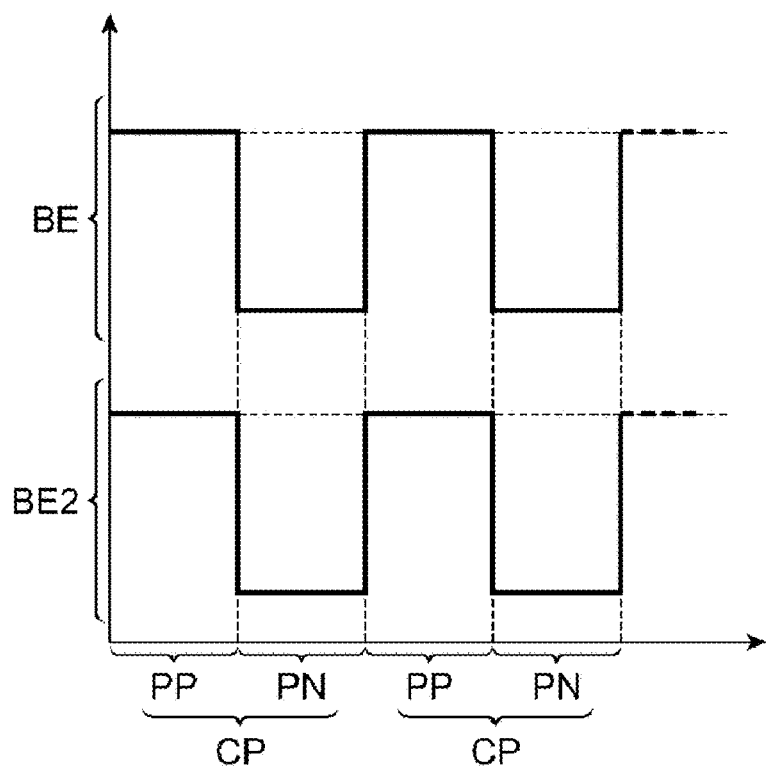

Hereinafter, reference is made to FIGS. 3A and 3B together with FIGS. 1 and 2. FIGS. 3A and 3B are diagrams showing an example of the electrical bias energy supplied to the bias electrode and an example of the electrical bias energy supplied to the ring electrode, respectively.

In one embodiment, the bias power source 62 (first bias power source or first bias RF power source) may generate radio frequency power, that is, radio frequency bias power (first bias RF power), as the electrical bias energy BE, as shown in FIG. 3A. The radio frequency bias power (and a voltage waveform thereof) serving as the electrical bias energy BE is a sine wave having a bias frequency. A reciprocal of the bias frequency is a time length of a period CP (cyclic period).

The bias power source 62 (first bias power source or first bias RF power source) is connected to the bias electrode (the base 18 in the embodiment of FIG. 2) via a matcher 62m and a filter 62f in order to supply radio frequency bias power to the bias electrode. The matcher 62m has a matching circuit configured to match impedance on the load side of the bias power source 62 with output impedance of the bias power source 62. The filter 62f has a frequency characteristic of selectively passing the electrical bias energy BE and has a characteristic of blocking or reducing the radio frequency power RF.

In another embodiment, as shown in FIG. 3B, the bias power source 62 (first bias power source or first voltage pulse power source) may be configured to periodically apply a voltage pulse as the electrical bias energy BE to the bias electrode (the base 18 in the embodiment of FIG. 2). That is, the electrical bias energy BE may be a sequence of first DC pulse signals or DC voltage pulses. The voltage pulse is applied to the bias electrode (the base 18 in the embodiment of FIG. 2) at a time interval (that is, the period CP) that is a reciprocal of the bias frequency. The voltage pulse may be a negative voltage pulse or a negative DC voltage pulse. The voltage pulse may have an arbitrary waveform such as a triangular wave, a square wave, or the like.

The plasma processing apparatus 1 may further include a radio frequency power source 63 (RF power source). The radio frequency power source 63 generates radio frequency power RF2 (RF power) to generate plasma above the substrate support 16. The radio frequency power RF2 may have the same frequency as the frequency of the radio frequency power RF. The radio frequency power source 63 is electrically connected to the ring electrode DR via a matcher 63m and a filter 63f. The matcher 63m has a matching circuit configured to match impedance on the load side of the radio frequency power source 63 with output impedance of the radio frequency power source 63. The filter 63f has a characteristic of selectively passing the radio frequency power RF2 and has a characteristic of blocking or reducing the electrical bias energy BE2 which will be described below.

The plasma processing apparatus 1 further includes a bias power source 64 (a second bias power source). The bias power source 64 is electrically coupled to the ring electrode DR and is configured to generate electrical bias energy BE2 applied to the ring electrode DR. The electrical bias energy BE2 has the same bias frequency as the bias frequency of the electrical bias energy BE.

As shown in FIG. 3A, the electrical bias energy BE2 may be radio frequency bias power (second bias RF power), like the electrical bias energy BE. In this case, the bias power source 64 (second bias power source or second bias RF power source) is connected to the ring electrode DR via a matcher 64m and a filter 64f. The matcher 64m has a matching circuit configured to match impedance on the load side of the bias power source 64 with output impedance of the bias power source 64. The filter 64f has a frequency characteristic of selectively passing the electrical bias energy BE2 and has a characteristic of blocking or reducing the radio frequency power RF2.

As shown in FIG. 3B, the electrical bias energy BE2 may be a sequence of voltage pulses, like the electrical bias energy BE. That is, the electrical bias energy BE2 generated by the bias power source 64 (second bias power source or second voltage pulse power source) may be a sequence of second DC pulse signals or DC voltage pulses. The voltage pulse of the electrical bias energy BE2 is periodically applied to the ring electrode DR at a time interval (that is, the period CP) which is a reciprocal of the bias frequency. The voltage pulse may be a negative voltage pulse or a negative DC voltage pulse. The voltage pulse may have an arbitrary waveform such as a triangular wave, a square wave, or the like.

As shown in FIGS. 3A and 3B, one cycle (the period CP or the cyclic period) of the electrical bias energy BE is composed of a positive phase period PP (second period) and a negative phase period PN (first period). Further, one cycle (the period CP or the cyclic period) of the electrical bias energy BE2 is composed of a positive phase period PP (fourth period) and a negative phase period PN (third period). In the negative phase period PN, each of the electrical bias energies BE and BE2 has a voltage lower than an average voltage thereof during one cycle (the period CP). In the positive phase period PP, each of the electrical bias energies BE and BE2 has a voltage higher than or equal to the average voltage thereof during one cycle (the period CP).

The negative phase period PN of the electrical bias energy BE2 generated by the bias power source 64 at least partially overlaps the negative phase period PN of the electrical bias energy BE generated by the bias power source 62. As shown in FIGS. 3A and 3B, the negative phase period PN of the electrical bias energy BE2 may coincide with the negative phase period PN of the electrical bias energy BE. That is, the phase of the electrical bias energy BE2 may be synchronized with the phase of the electrical bias energy BE.

When the electrical bias energies BE and BE2 are the first and second bias RF powers, respectively, first and second power levels of the first and second bias RF powers, respectively, may be the same as or different from each other. The second power level may be greater or less than the first power level.

When the electrical bias energy BE is a first voltage pulse signal, the first voltage pulse signal has a first voltage level during the first period and a second voltage level during the second period. The absolute value of the first voltage level is greater than the absolute value of the second voltage level. Further, when the electrical bias energy BE2 is a second voltage pulse signal, the second voltage pulse signal has a third voltage level during the third period and a fourth voltage level during the fourth period. The absolute value of the third voltage level is greater than the absolute value of the fourth voltage level. The first voltage level and the third voltage level may be negative levels. The third voltage level may be the same as the first voltage level and the fourth voltage level may be the same as the second voltage level. Alternatively, the third voltage level may be different from the first voltage level.

When the electrical bias energies BE and BE2 are the first and second voltage pulse signals, respectively, the first period may have the same length as the second period. Alternatively, the first period may have a different length than the length of the second period. The length of the first period may be longer or shorter than the length of the second period.

In one embodiment, the plasma processing apparatus 1 may further include a controller MC. The controller MC is a computer including a processor, a storage device, an input device, a display device, and the like, and controls each part of the plasma processing apparatus 1. Specifically, the controller MC executes a control program stored in the storage device and controls each part of the plasma processing apparatus 1 based on recipe data stored in the storage device. Under the control of the controller MC, a process specified by the recipe data is executed in the plasma processing apparatus 1.

In the positive phase period PP described above, since the thickness of the sheath on the substrate W is small and the impedance between the substrate W and the plasma is small, a relatively large amount of radio frequency power RF is coupled to the plasma above the substrate W. On the other hand, during the negative phase period PN, the thickness of the sheath on the substrate W is large, and the impedance between the substrate W and the plasma is large. In the plasma processing apparatus 1, in order to increase the thickness of the sheath at the radial outer side of the edge of the substrate W during the negative phase period PN and to increase the impedance between the ring electrode DR and the plasma, the electrical bias energy BE2 is supplied to the ring electrode DR. Therefore, the radio frequency power RF coupled to the plasma above the ring electrode DR during the negative phase period PN is suppressed. As a result, the fluctuation in the spread of the plasma in the radial direction during the period CP of the electrical bias energy BE supplied to the bias electrode is suppressed. Further, it is possible to suppress an abnormality in a shape formed at the edge of the substrate W and formed in the vicinity thereof by etching.

Figure 4:
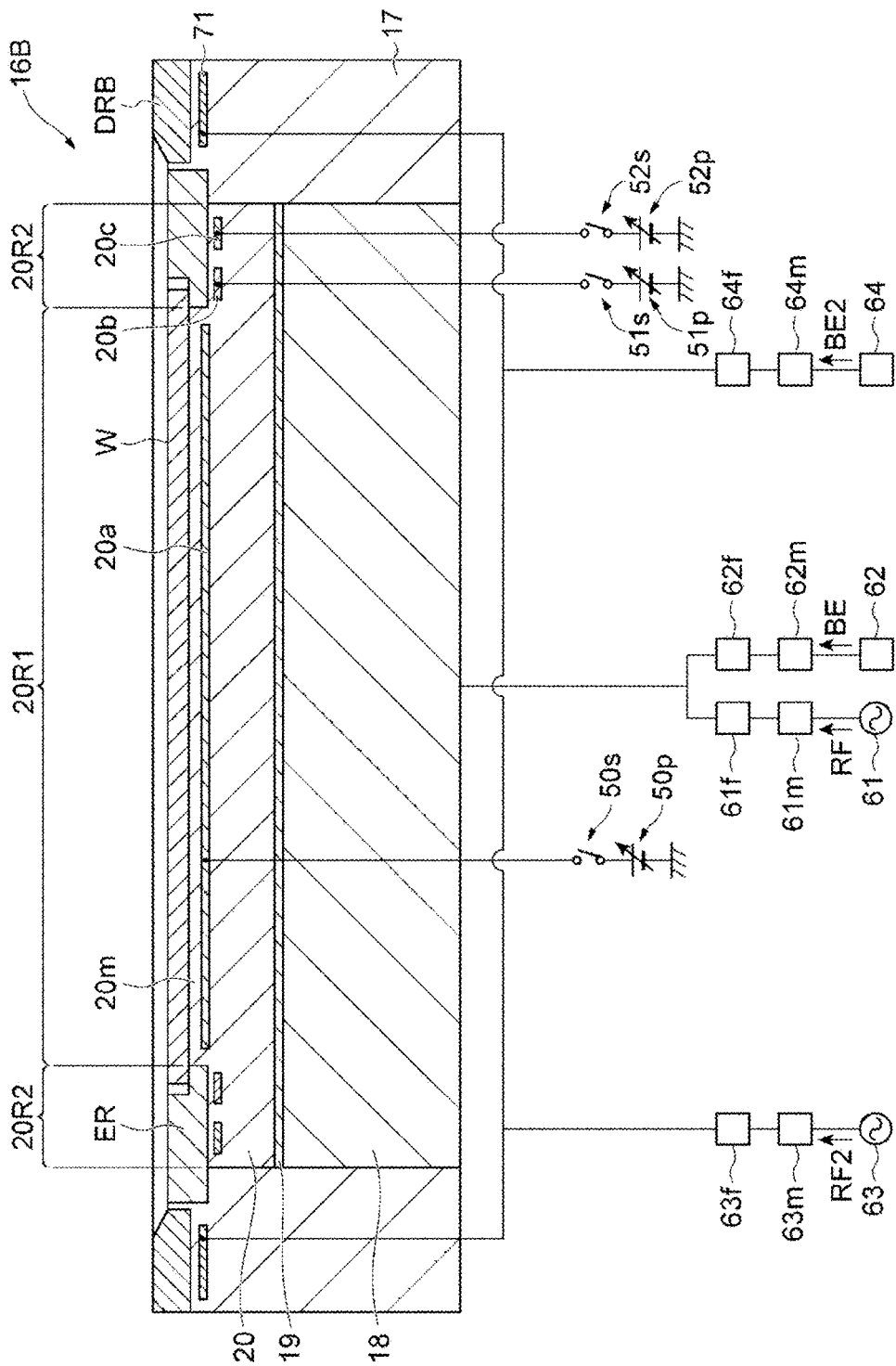
FIG. 4 is a diagram showing a substrate support and a plurality of power supplies according to another exemplary embodiment.

Hereinafter, FIG. 4 will be referred to. FIG. 4 is a diagram showing a substrate support and a plurality of power supplies according to another exemplary embodiment. Hereinafter, differences between the embodiment of FIG. 2 and the embodiment of FIG. 4 will be described.

A substrate support 16B of the embodiment of FIG. 4 can be adopted as the substrate support of the plasma processing apparatus 1. In the embodiment of FIG. 4, a ring electrode DRB is provided and extends at the radial outer side of the edge ring ER. The ring electrode DRB may have substantially a ring shape in a plan view. The ring electrode DRB extends to surround the edge ring ER and is disposed on the dielectric part 17. The ring electrode DRB is formed of a conductive material such as silicon or silicon carbide.

In the substrate support 16B, an auxiliary electrode 71 is provided in the dielectric part 17 below the ring electrode DRB. The auxiliary electrode 71 has a ring shape and may extend around the axis AX in the circumferential direction. Other configurations of the substrate support 16B are the same as the corresponding configurations of the substrate support 16 shown in FIG. 2. In the embodiment of FIG. 4, the radio frequency power source 63 and the bias power source 64 are electrically connected to the auxiliary electrode 71 and are capacitively coupled to the ring electrode DRB via the auxiliary electrode 71.

Figure 5:
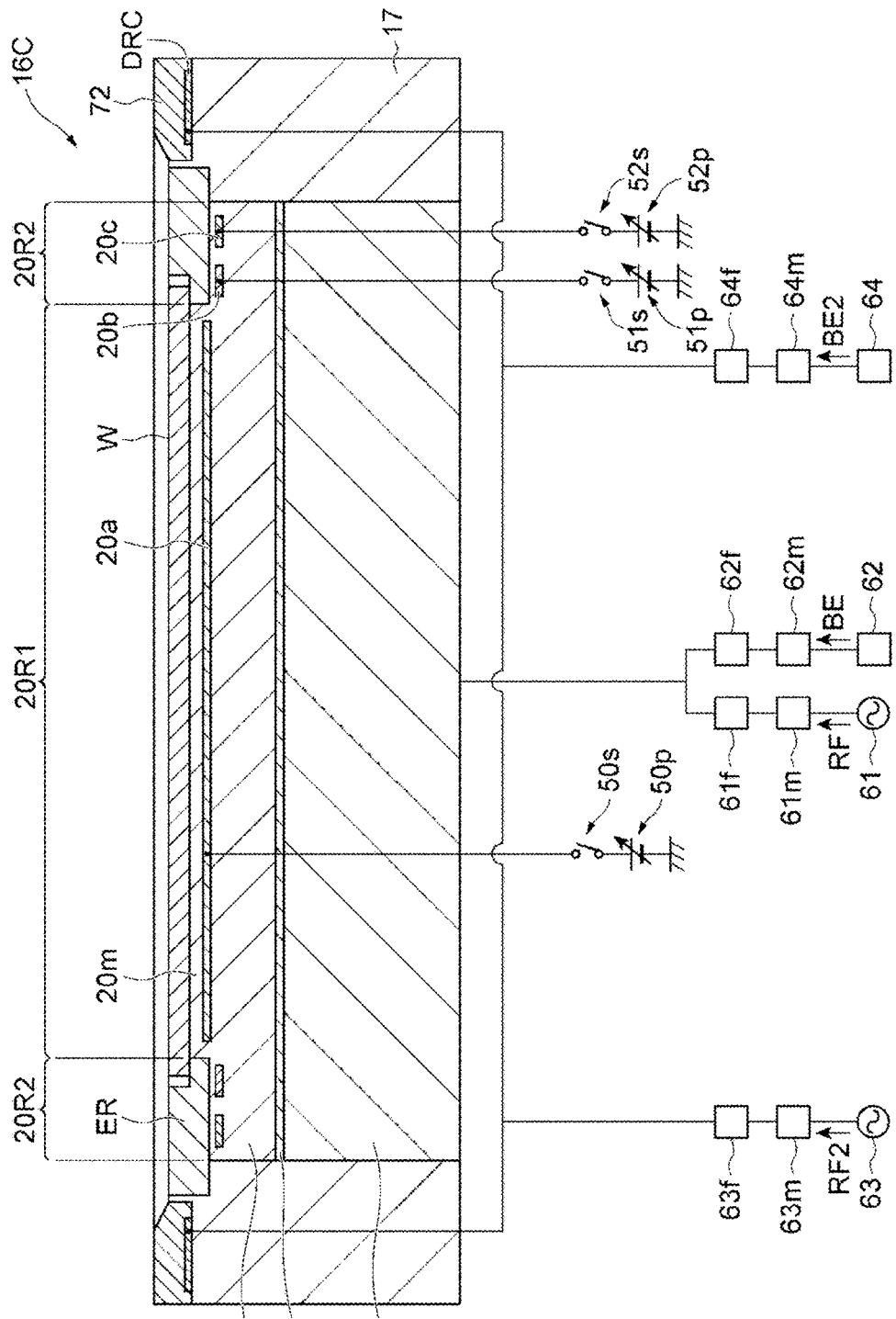
FIG. 5 is a diagram showing a substrate support and a plurality of power supplies according to still another exemplary embodiment.

Hereinafter, FIG. 5 will be referred to. FIG. 5 is a diagram showing a substrate support and a plurality of power supplies according to still another exemplary embodiment. Hereinafter, differences between the embodiment of FIG. 2 and the embodiment of FIG. 5 will be described.

A substrate support 16C of the embodiment of FIG. 5 can be adopted as the substrate support of the plasma processing apparatus 1. In the embodiment of FIG. 5, a ring member 72 extends at the radial outer side of the edge ring ER. The ring member 72 may have substantially a ring shape in a plan view. The ring member 72 extends to surround the edge ring ER and is disposed on the dielectric part 17. The ring member 72 is formed of a dielectric such as quartz or aluminum oxide.

In the substrate support 16C, the ring electrode DRC is provided in the ring member 72. The ring electrode DRC has a ring shape and may extend around the axis AX in the circumferential direction. Other configurations of the substrate support 16C are the same as the corresponding configurations of the substrate support 16B. In the embodiment of FIG. 5, the radio frequency power source 63 and the bias power source 64 are electrically connected to the ring electrode DRC. The ring electrode DRC may be provided in a region away from the ring member 72, for example, in the dielectric part 17.

Figure 6:
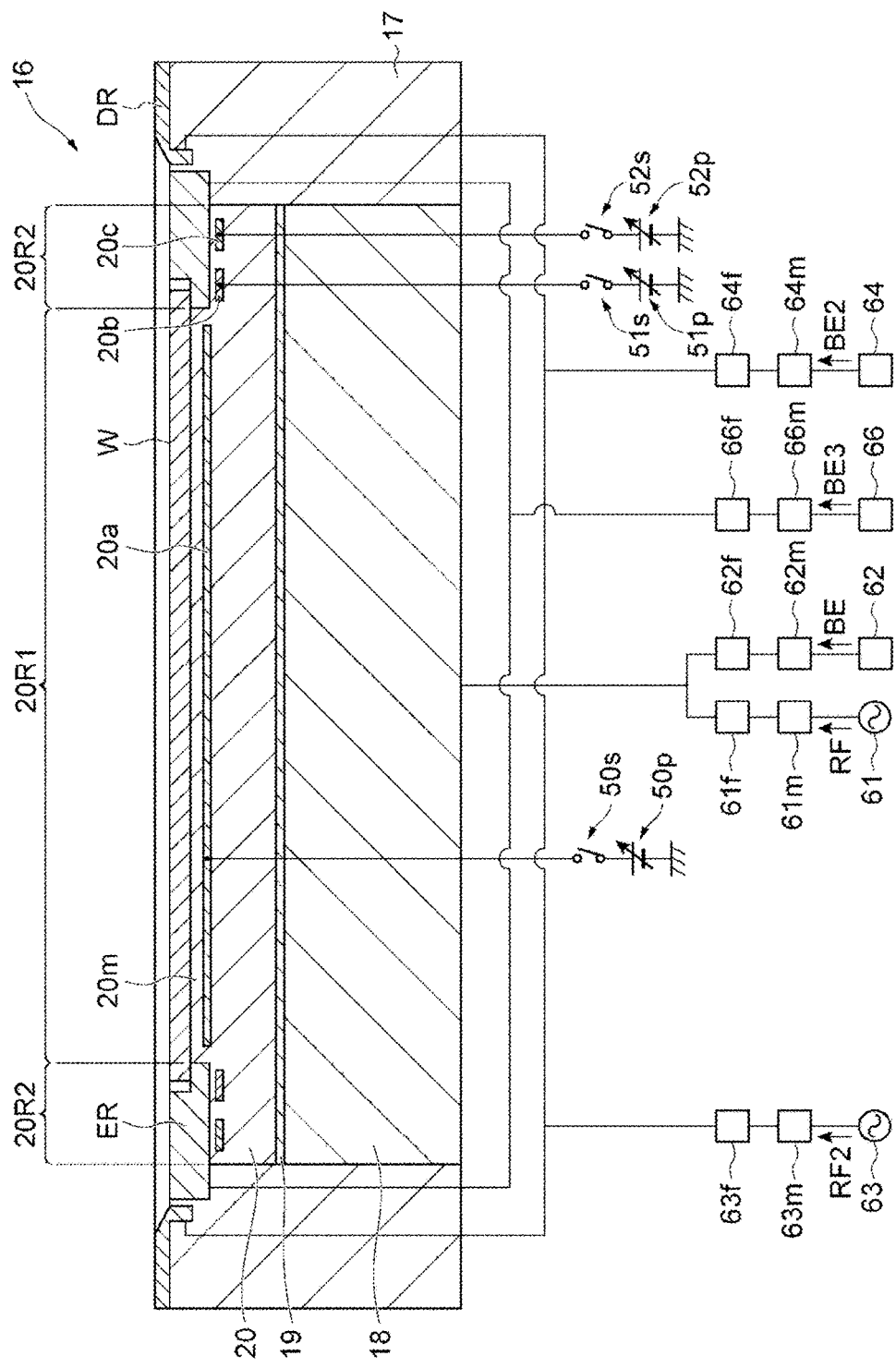
FIG. 6 is a diagram showing a substrate support and a plurality of power supplies according to yet another exemplary embodiment.

Hereinafter, FIG. 6 will be referred to. FIG. 6 is a diagram showing a substrate support and a plurality of power supplies according to yet another exemplary embodiment. Hereinafter, differences between the embodiment of FIG. 2 and the embodiment of FIG. 6 will be described.

In the embodiment of FIG. 6, the plasma processing apparatus 1 further includes a bias power source 66. The bias power source 66 is electrically coupled to the edge ring ER and is configured to generate electrical bias energy BE3 applied to the edge ring ER. The electrical bias energy BE3 may have the same bias frequency as the bias frequency of the electrical bias energy BE.

The electrical bias energy BE3 may be radio frequency bias power (third bias RF power), like the electrical bias energy BE. In this case, a bias power source 66 is connected to the edge ring ER via a matcher 66m and a filter 66f. The matcher 66m has a matching circuit configured to match impedance on the load side of the bias power source 66 with output impedance of the bias power source 66 (third bias RF power source). The filter 66f has a frequency characteristic of selectively passing the electrical bias energy BE3 and has a characteristic of blocking or reducing the radio frequency power RF.

Alternatively, the electrical bias energy BE3 may be a sequence of voltage pulses or a third voltage pulse signal, like the electrical bias energy BE. The voltage pulse of the electrical bias energy BE3 is periodically applied to the ring electrode DR at a time interval (that is, the period CP) which is a reciprocal of the bias frequency.

According to the embodiment of FIG. 6, it is possible to independently control the electrical bias energy applied to the edge ring ER and to independently control the thickness of the sheath on the edge ring ER. In each of the substrate support 16B and the substrate support 16C, the bias power source 66 may be electrically coupled to the edge ring ER.

Figure 7:
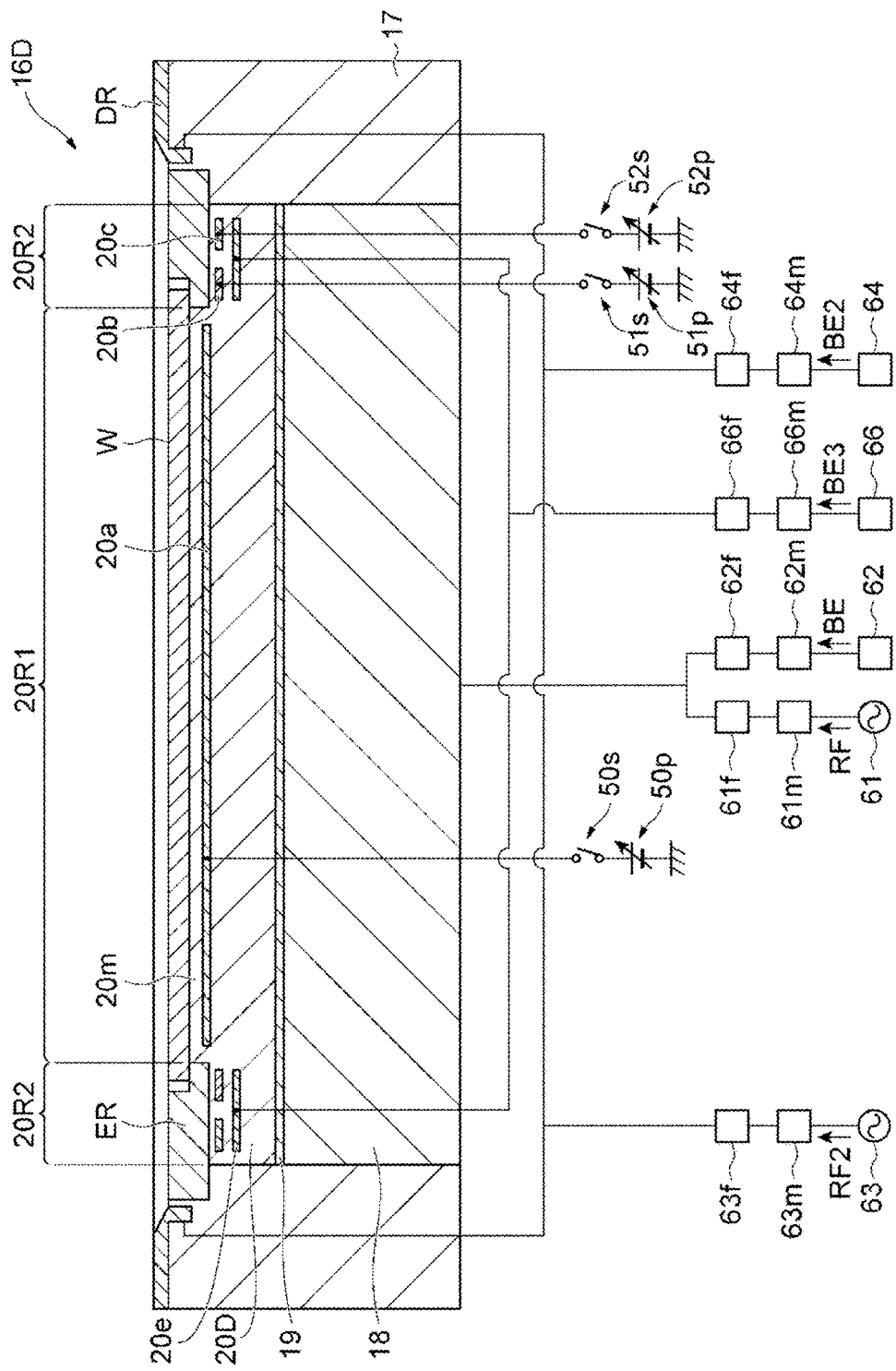
FIG. 7 is a diagram showing a substrate support and a plurality of power supplies according to yet another exemplary embodiment.

Hereinafter, FIG. 7 will be referred to. FIG. 7 is a diagram showing a substrate support and a plurality of power supplies according to yet another exemplary embodiment. Hereinafter, differences between the embodiment of FIG. 6 and the embodiment of FIG. 7 will be described.

A substrate support 16D shown in FIG. 7 can be adopted as the substrate support of the plasma processing apparatus 1. An electrostatic chuck 20D of the substrate support 16D further includes an electrode 20e. Other configurations of the substrate support 16D are the same as the corresponding configurations of the substrate support 16 shown in FIG. 6. The electrode 20e is a film formed of a conductive material and is provided in the main body 20m in the second region 20R2. The electrode 20e may have a ring shape or may extend around the axis AX in the circumferential direction. In the embodiment of FIG. 7, the bias power source 66 is electrically connected to the electrode 20e and is capacitively coupled to the edge ring ER via the electrode 20e.

In each of the substrate support 16B and the substrate support 16C, the bias power source 66 may be electrically coupled to the edge ring ER via the electrode 20e. Further, the bias power source 66 may be electrically connected to the chuck electrode 20b and the chuck electrode 20c. In this case, the substrate support may not include the electrode 20e.

Figure 8:
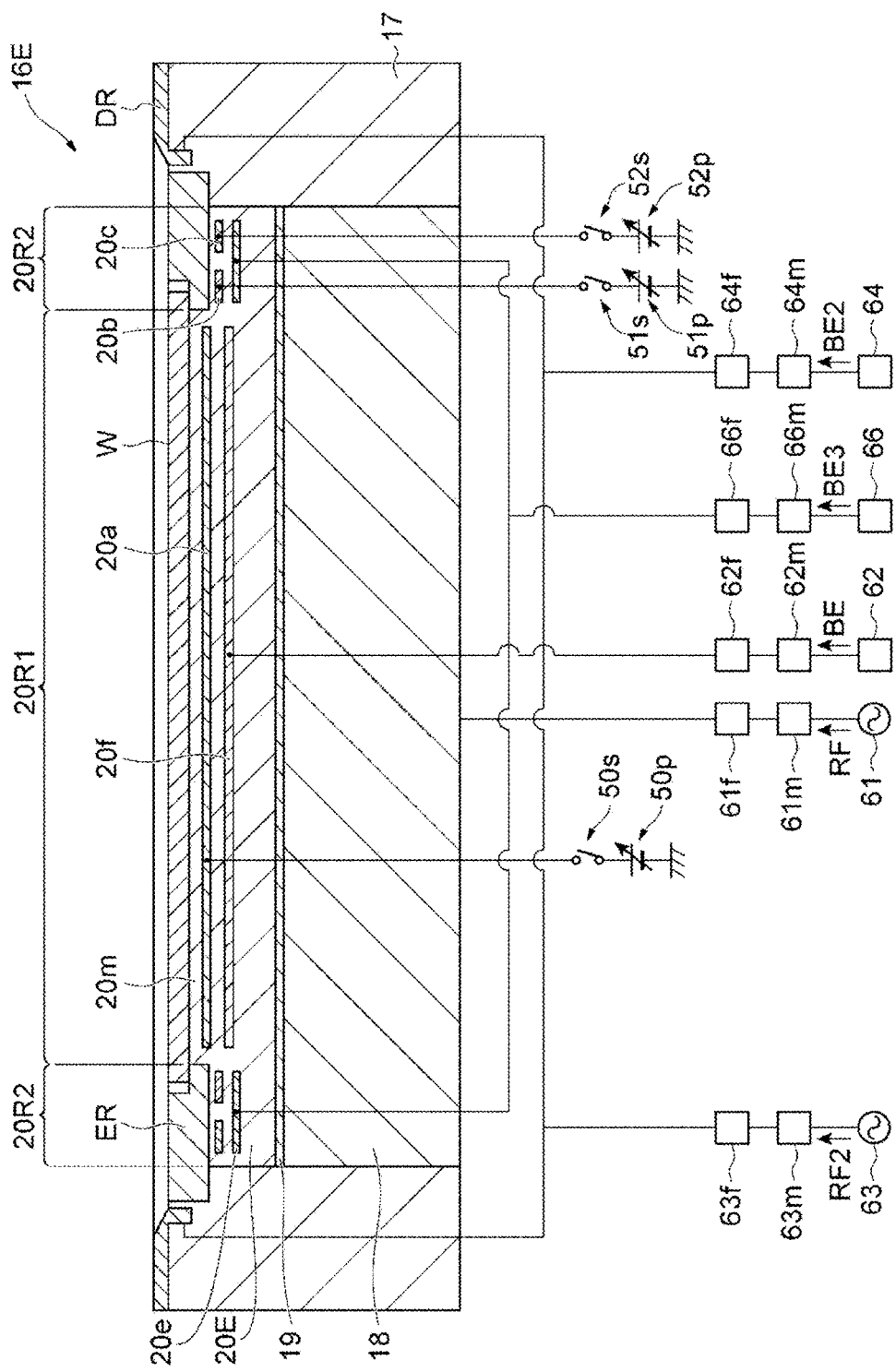
FIG. 8 is a diagram showing a substrate support and a plurality of power supplies according to yet another exemplary embodiment.

Hereinafter, FIG. 8 will be referred to. FIG. 8 is a diagram showing a substrate support and a plurality of power supplies according to yet another exemplary embodiment. Hereinafter, differences between the embodiment of FIG. 7 and the embodiment of FIG. 8 will be described.

A substrate support 16E shown in FIG. 8 can be adopted as the substrate support of the plasma processing apparatus 1. An electrostatic chuck 20E of the substrate support 16E further includes an electrode 20f. Other configurations of the substrate support 16E are the same as the corresponding configurations of the substrate support 16D. The electrode 20f is a film formed of a conductive material and is provided in the main body 20m in the first region 20R1. The electrode 20f may have substantially a circular shape, and the center thereof may be located on the axis AX. In the embodiment of FIG. 8, the bias power source 62 is electrically connected to the electrode 20f. That is, the electrode 20f constitutes a bias electrode in the substrate support 16E.

In each of the substrate support 16B and the substrate support 16C, the bias power source 62 may be electrically connected to the electrode 20f. Further, the bias power source 62 may be electrically connected to the chuck electrode 20a. In this case, the chuck electrode 20a constitutes the bias electrode. In this case, the substrate support may not include the electrode 20f.

Figure 9:
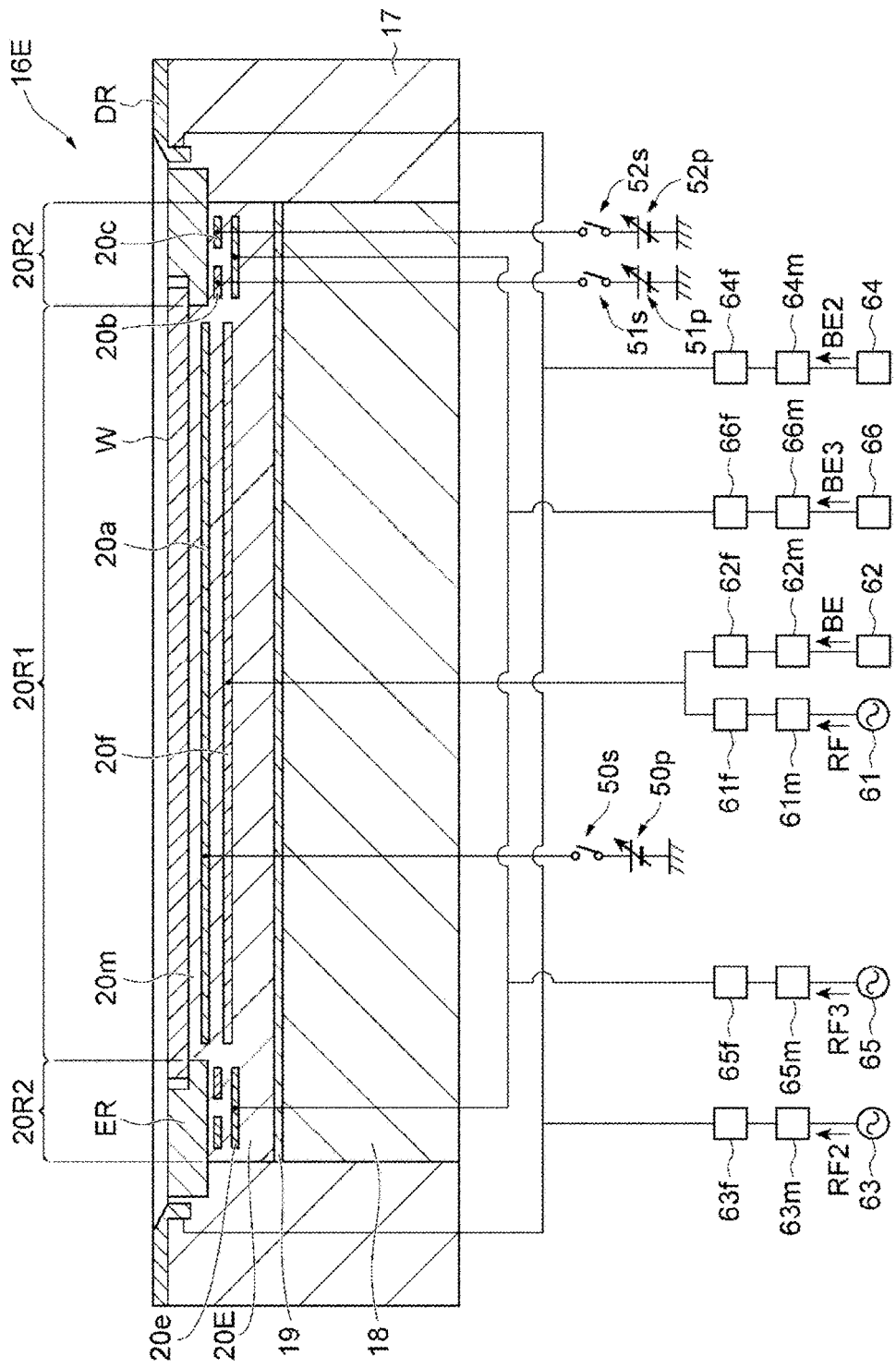
FIG. 9 is a diagram showing a substrate support and a plurality of power supplies according to yet another exemplary embodiment.

Hereinafter, FIG. 9 will be referred to. FIG. 9 is a diagram showing a substrate support and a plurality of power supplies according to yet another exemplary embodiment. Hereinafter, differences between the embodiment of FIG. 8 and the embodiment of FIG. 9 will be described.

In the embodiment of FIG. 9, the radio frequency power source 61 and the bias power source 62 are electrically connected to the electrode 20f. That is, the electrode 20f constitutes a radio frequency electrode and a bias electrode in the substrate support 16E.

Further, in the embodiment of FIG. 9, the plasma processing apparatus 1 further includes a radio frequency power source 65. The radio frequency power source 65 generates radio frequency power RF3 (RF power) to generate plasma above the substrate support 16. The radio frequency power RF3 may have the same frequency as the frequency of the radio frequency power RF. The radio frequency power source is electrically connected to the electrode 20e via a matcher 65m and a filter 65f. The matcher 65m has a matching circuit configured to match impedance on the load side of the radio frequency power source 65 with output impedance of the radio frequency power source 65. The filter 65f has a characteristic of selectively passing the radio frequency power RF3 and has a characteristic of blocking or reducing the electrical bias energy BE3.

In each of the substrate support 16B and the substrate support 16C, the radio frequency power source 61 and the bias power source 62 may be electrically connected to the electrode 20f. Further, in each of the substrate support 16B and the substrate support 16C, the radio frequency power source 65 and the bias power source 66 may be electrically connected to the electrode 20e.

Figure 10:
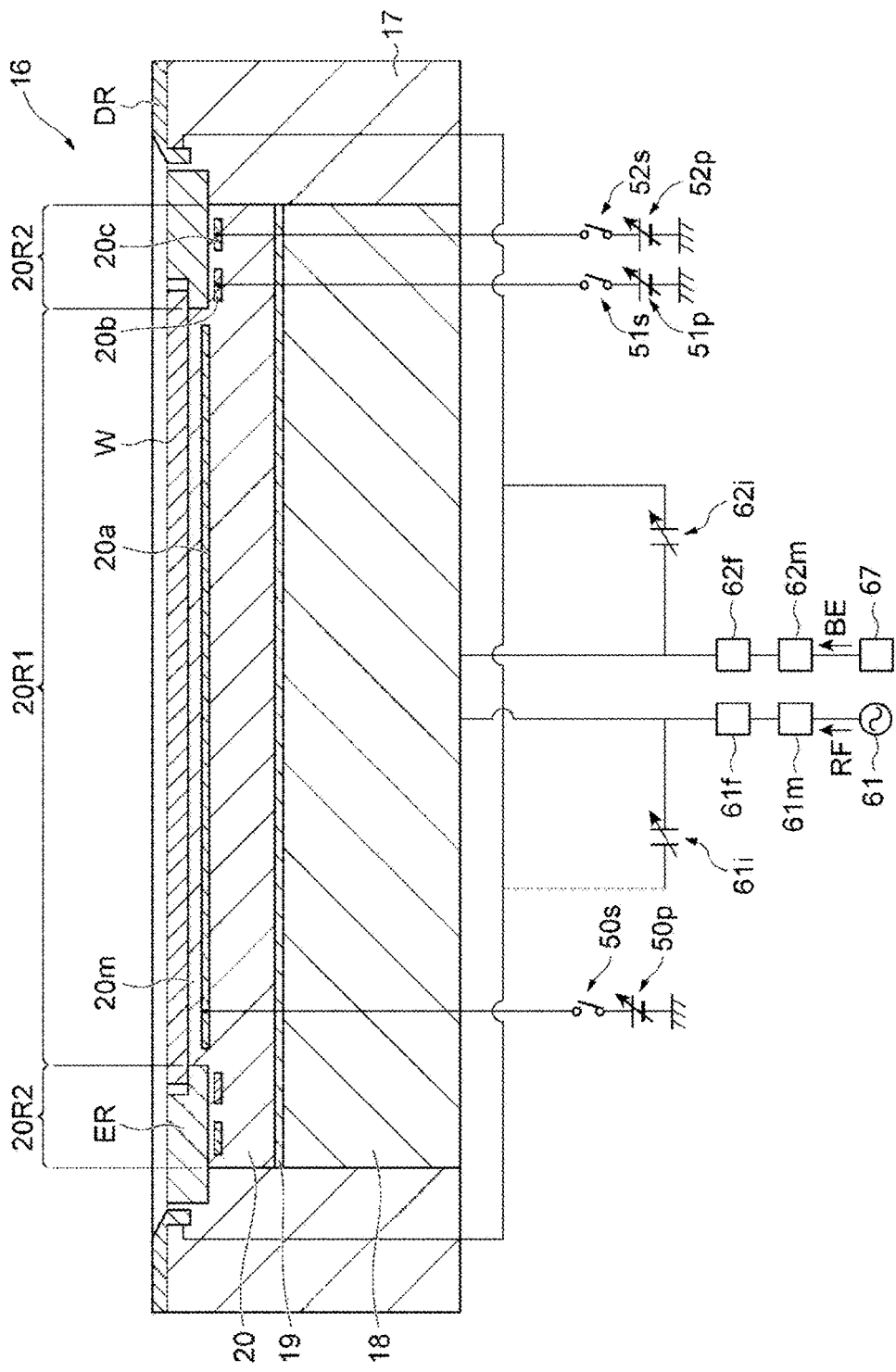
FIG. 10 is a diagram showing a substrate support and a plurality of power supplies according to yet another exemplary embodiment.

Hereinafter, FIG. 10 will be referred to. FIG. 10 is a diagram showing a substrate support and a plurality of power supplies according to yet another exemplary embodiment. Hereinafter, differences between the embodiment of FIG. 10 and the embodiment of FIG. 2 will be described.

In the embodiment of FIG. 10, the plasma processing apparatus 1 does not include the radio frequency power source 63 and the bias power source 64. In the embodiment of FIG. 10, the radio frequency power source 61 is electrically connected to the ring electrode DR in addition to the radio frequency electrode of the substrate support 16 (the base 18 in the embodiment of FIG. 10). In the embodiment of FIG. 10, the radio frequency power RF is distributed to the radio frequency electrode of the substrate support 16 and the ring electrode DR. A distribution ratio of the radio frequency power RF between the radio frequency electrode of the substrate support 16 and the ring electrode DR is adjusted by an impedance adjustor 61i. The impedance adjustor 61i is connected between a node on an electrical path that connects the radio frequency power source 61 to the radio frequency electrode of the substrate support 16 and the ring electrode DR. The impedance adjustor 61i has a variable impedance. The impedance adjustor 61i may include, for example, a variable capacitance capacitor.

Further, in the embodiment of FIG. 10, the bias power source 62 is electrically connected to the ring electrode DR in addition to the bias electrode of the substrate support 16 (the base 18 in the embodiment of FIG. 10). That is, in the embodiment of FIG. 10, a single bias power source 67 serves as both the first bias RF power source and the second bias RF power source. In the embodiment of FIG. 10, the electrical bias energy BE is distributed to the bias electrode of the substrate support 16 and the ring electrode DR. The distribution ratio of the electrical bias energy BE between the bias electrode of the substrate support 16 and the ring electrode DR is adjusted by an impedance adjustor 62i. The impedance adjustor 62i is connected between the node on the electrical path that connects the bias power source 62 to the bias electrode of the substrate support 16 and the ring electrode DR. The impedance adjustor 62i has a variable impedance. The impedance adjustor 62i may include, for example, a variable capacitance capacitor.

In the embodiment of FIG. 10, the electrical bias energy BE from the single bias power source 67 is distributed to the bias electrode of the substrate support 16 and the ring electrode DR. Therefore, the phase of the electrical bias energy applied to the bias electrode of the substrate support 16 and the phase of the electrical bias energy applied to the ring electrode DR are synchronized with each other. Therefore, the radio frequency power RF coupled to the plasma above the ring electrode DR during the negative phase period PN is suppressed. As a result, the fluctuation in the spread of the plasma in the radial direction during the period of the electrical bias energy BE supplied to the bias electrode of the substrate support 16 is suppressed.

Similar to the embodiment of FIG. 10, in the substrate support 16B, the radio frequency power RF from the radio frequency power source 61 may be distributed to the radio frequency electrode of the substrate support 16 and the ring electrode DRB. Further, similarly to the embodiment of FIG. 10, in the substrate support 16B, the electrical bias energy BE from the bias power source 62 may be distributed to the bias electrode of the substrate support 16 and the ring electrode DRB. Further, similarly to the embodiment of FIG. 10, in the substrate support 16C, the radio frequency power RF from the radio frequency power source 61 may be distributed to the radio frequency electrode of the substrate support 16 and the ring electrode DRC. Further, similarly to the embodiment of FIG. 10, in the substrate support 16C, the electrical bias energy BE from the bias power source 62 may be distributed to the bias electrode of the substrate support 16 and the ring electrode DRC.

Figure 11:
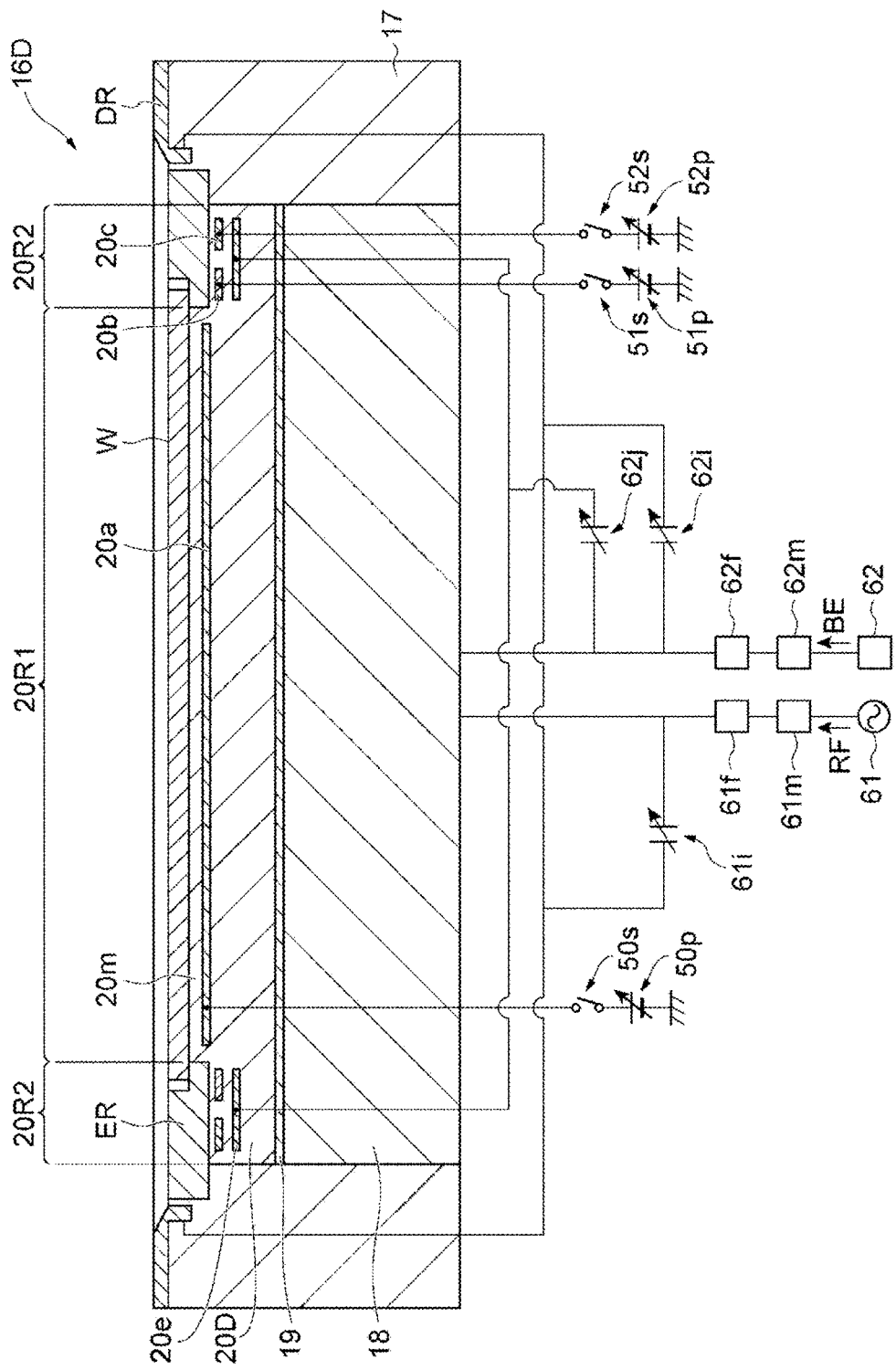
FIG. 11 is a diagram showing a substrate support and a plurality of power supplies according to yet another exemplary embodiment.

Hereinafter, FIG. 11 will be referred to. FIG. 11 is a diagram showing a substrate support and a plurality of power supplies according to yet another exemplary embodiment. Hereinafter, differences between the embodiment of FIG. 10 and the embodiment of FIG. 11 will be described.

In the embodiment shown in FIG. 11, the plasma processing apparatus 1 includes the substrate support 16D. The substrate support 16D is the same as the substrate support 16D shown in FIG. 7. In the embodiment shown in FIG. 11, the bias power source 62 is further electrically connected to the electrode 20e. In the embodiment of FIG. 11, the electrical bias energy BE is distributed to the bias electrode of the substrate support 16, the ring electrode DR, and the electrode 20e. A distribution ratio of the electrical bias energy BE to the bias electrode of the substrate support 16, the ring electrode DR, and the electrode 20e is adjusted by the impedance adjustor 62i and an impedance adjustor 62j. The impedance adjustor 62j is connected between the node on the electrical path that connects the bias power source 62 to the bias electrode of the substrate support 16 and the electrode 20e. The impedance adjustor 62j has a variable impedance. The impedance adjustor 62j may include, for example, a variable capacitance capacitor.

Similar to the embodiment of FIG. 11, in the substrate support 16B, the radio frequency power RF from the radio frequency power source 61 may be distributed to the radio frequency electrode of the substrate support 16 and the ring electrode DRB. Further, similarly to the embodiment of FIG. 11, in the substrate support 16B, the electrical bias energy BE from the bias power source 62 may be distributed to the bias electrode of the substrate support 16, the ring electrode DRB, and the electrode 20e. Further, similarly to the embodiment of FIG. 11, in the substrate support 16C, the radio frequency power RF from the radio frequency power source 61 may be distributed to the radio frequency electrode of the substrate support 16 and the ring electrode DRC. Further, similarly to the embodiment of FIG. 11, in the substrate support 16C, the electrical bias energy BE from the bias power source 62 may be distributed to the bias electrode of the substrate support 16, the ring electrode DRC, and the electrode 20e.

Figure 12:
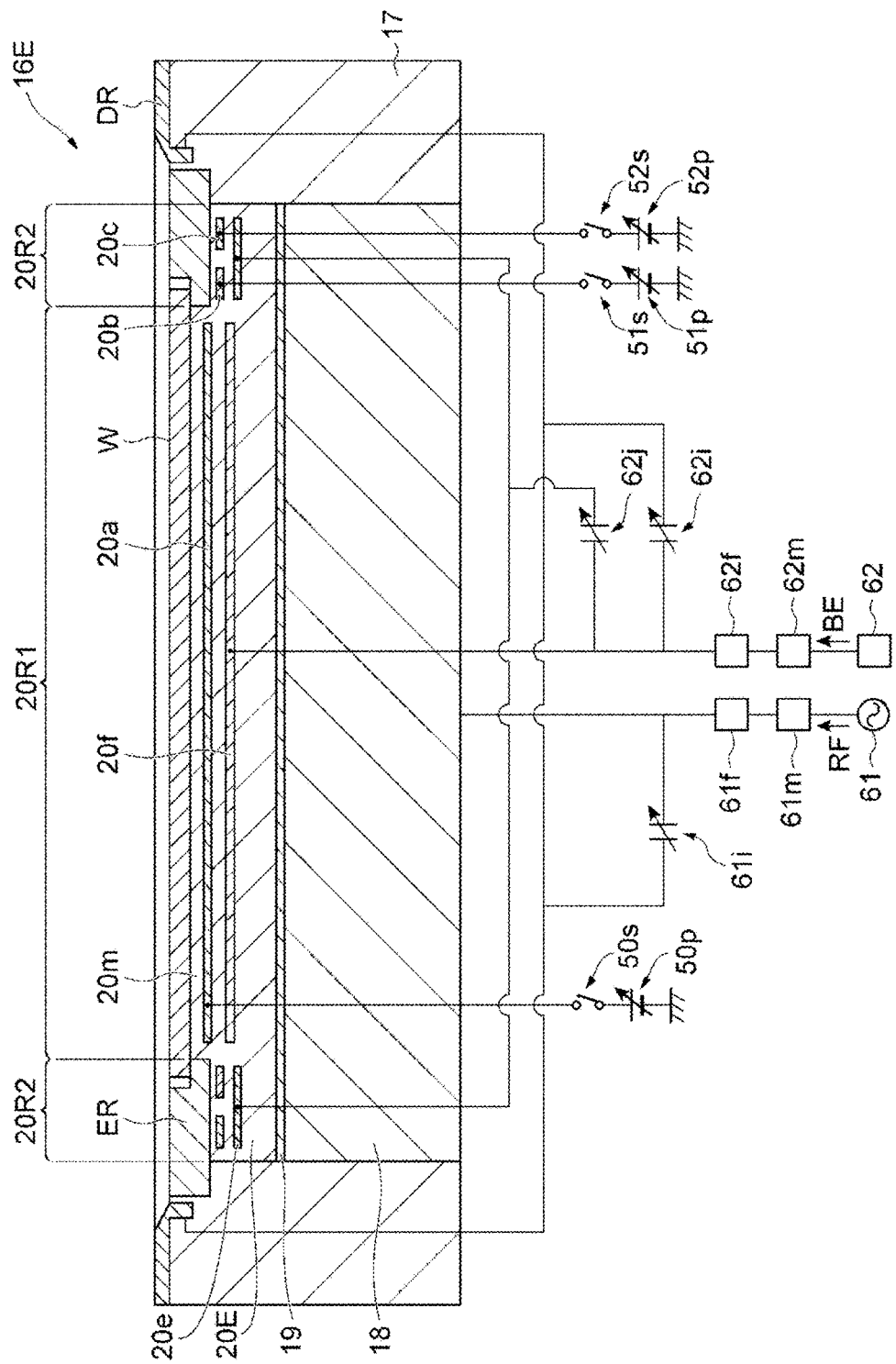
FIG. 12 is a diagram showing a substrate support and a plurality of power supplies according to yet another exemplary embodiment.

Hereinafter, FIG. 12 will be referred to. FIG. 12 is a diagram showing a substrate support and a plurality of power supplies according to yet another exemplary embodiment. Hereinafter, differences between the embodiment of FIG. 11 and the embodiment of FIG. 12 will be described.

In the embodiment shown in FIG. 12, the plasma processing apparatus 1 includes the substrate support 16E. The substrate support 16E is the same as the substrate support 16E shown in FIG. 8. In the embodiment shown in FIG. 12, the bias power source 62 is electrically connected to the electrode 20f.

Similar to the embodiment of FIG. 12, in the substrate support 16B, the radio frequency power RF from the radio frequency power source 61 may be distributed to the radio frequency electrode of the substrate support 16 and the ring electrode DRB. Further, similarly to the embodiment of FIG. 12, in the substrate support 16B, the electrical bias energy BE from the bias power source 62 may be distributed to the electrode 20f, the ring electrode DRB, and the electrode 20e. Further, similar to the embodiment of FIG. 12, in the substrate support 16C, the radio frequency power RF from the radio frequency power source 61 may be distributed to the radio frequency electrode of the substrate support 16 and the ring electrode DRC. Further, similarly to the embodiment of FIG. 11, in the substrate support 16C, the electrical bias energy BE from the bias power source 62 may be distributed to the electrode 20f, the ring electrode DRC, and the electrode 20e.

Figure 13:
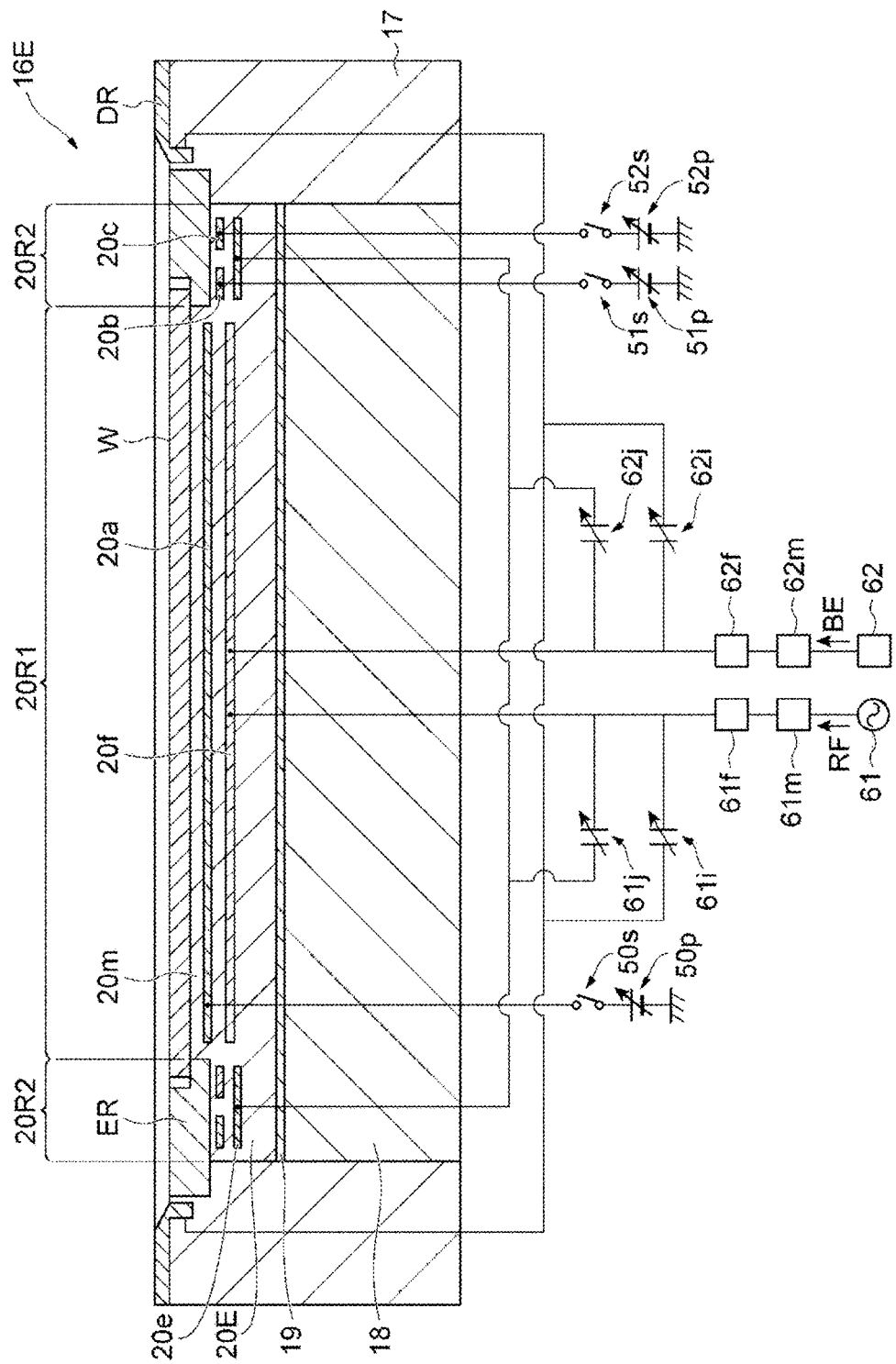
FIG. 13 is a diagram showing a substrate support and a plurality of power supplies according to yet another exemplary embodiment.

Hereinafter, FIG. 13 will be referred to. FIG. 13 is a diagram showing a substrate support and a plurality of power supplies according to yet another exemplary embodiment. Hereinafter, differences between the embodiment of FIG. 12 and the embodiment of FIG. 13 will be described.

In the embodiment shown in FIG. 13, the radio frequency power source 61 is electrically connected to the electrode 20f and further electrically connected to the electrode 20e. In the embodiment of FIG. 13, the radio frequency power RF is distributed to the electrode 20f, the ring electrode DR, and the electrode 20e. A distribution ratio of the radio frequency power RF to the electrode 20f, the ring electrode DR, and the electrode 20e is adjusted by the impedance adjustor 61i and the impedance adjustor 61j. The impedance adjustor 61j is connected between the node on the electrical path that connects the radio frequency power source 61 to the electrode 20f, and the electrode 20e. The impedance adjustor 61j has a variable impedance. The impedance adjustor 61j may include, for example, a variable capacitance capacitor.

Similar to the embodiment of FIG. 13, in the substrate support 16B, the radio frequency power RF from the radio frequency power source 61 may be distributed to the electrode 20f, the ring electrode DRB, and the electrode 20e. Further, similarly to the embodiment of FIG. 13, in the substrate support 16B, the electrical bias energy BE from the bias power source 62 may be distributed to the electrode 20f, the ring electrode DRB, and the electrode 20e. Further, similarly to the embodiment of FIG. 13, in the substrate support 16C, the radio frequency power RF from the radio frequency power source 61 may be distributed to the electrode 20f, the ring electrode DRC, and the electrode 20e. Further, similarly to the embodiment of FIG. 13, in the substrate support 16C, the electrical bias energy BE from the bias power source 62 may be distributed to the electrode 20f, the ring electrode DRC, and the electrode 20e.

Figure 14:
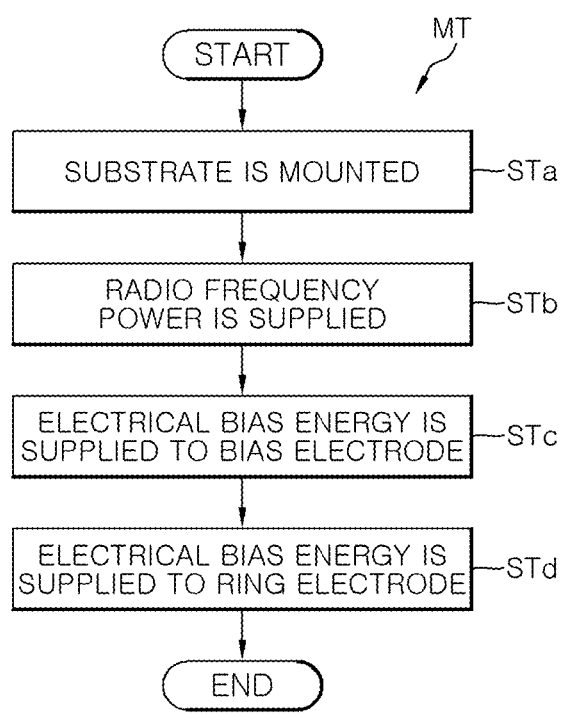
FIG. 14 is a flowchart of a plasma processing method according to one exemplary embodiment.

Hereinafter, FIG. 14 will be referred to. FIG. 14 is a flowchart of a plasma processing method according to one exemplary embodiment. The plasma processing method shown in FIG. 14 (hereinafter referred to as a "method MT") can be performed using any of the various plasma processing apparatus described above.

The method MT starts in step STa. In step STa, the substrate W is mounted on the substrate support of the plasma processing apparatus 1. In step STa, the substrate W is disposed in the region surrounded by the edge ring ER. The method MT further includes steps STb to STd. Steps STb to STd are performed in a state in which the substrate W is mounted on the substrate support.

In step STb, the radio frequency power RF is supplied to generate plasma above the substrate support. In the plasma processing apparatus 1 including the radio frequency power source 63, the radio frequency power RF2 may be further supplied. Further, in the plasma processing apparatus 1 including the radio frequency power source 65, the radio frequency power RF3 may be further supplied. In the method MT, steps STc and STd are performed during a period in which step STb is performed, that is, during a period in which the plasma is generated in the chamber 10.

In step STc, the electrical bias energy BE is supplied to the bias electrode (the base 18, the electrode 20f, or the chuck electrode 20a) of the substrate support. In step STd, the electrical bias energy BE or BE2 is supplied to the ring electrode DR, DRB, or DRC.

In step STd of one embodiment, the electrical bias energy BE2 is supplied to the ring electrode. The negative phase period PN of the electrical bias energy BE2 at least partially overlaps the negative phase period PN of the electrical bias energy BE supplied to the bias electrode of the substrate support. The negative phase period PN of the electrical bias energy BE2 may coincide with the negative phase period PN of the electrical bias energy BE supplied to the bias electrode of the substrate support. The phase of the electrical bias energy BE2 may be synchronized with the phase of the electrical bias energy BE supplied to the bias electrode of the substrate support.

In steps STc and STd of another embodiment, the electrical bias energy BE from the single bias power source 67 is distributed to the bias electrode of the substrate support and the ring electrode. Therefore, the negative phase period PN of the electrical bias energy supplied to the ring electrode coincides with the negative phase period PN of the electrical bias energy supplied to the bias electrode of the substrate support. That is, the phase of the electrical bias energy supplied to the ring electrode coincides with the phase of the electrical bias energy supplied to the bias electrode of the substrate support.

Here, various exemplary embodiments included in the present disclosure are described in the following [E1] to [E12] and [F1] to [F19].

[E1]

A plasma processing apparatus comprising:

a chamber;

a substrate support provided in the chamber, configured to support a substrate mounted thereon and an edge ring mounted thereon to surround the substrate, and including a bias electrode;

a radio frequency power source configured to generate radio frequency power to generate plasma above the substrate support;

a ring electrode configured to extend at a radial outer side of the edge ring;

a first bias power source electrically coupled to the bias electrode; and a second bias power source electrically coupled to the ring electrode, wherein each of the first bias power source and the second bias power source is configured to generate electrical bias energy having a bias frequency, one cycle of the electrical bias energy having a time length that is a reciprocal of the bias frequency includes a negative phase period in which the electrical bias energy has a voltage lower than an average voltage thereof during the one cycle, and the negative phase period of the electrical bias energy generated by the second bias power source at least partially overlaps the negative phase period of the electrical bias energy generated by the first bias power source.

One cycle of electrical bias energy includes the negative phase period described above and a positive phase period. In the positive phase period, the electrical bias energy has a voltage greater than or equal to its average voltage during the one cycle. During the positive phase period, the thickness of the sheath on the substrate is small and the impedance between the substrate and the plasma is small, so that a relatively large amount of radio frequency power is coupled to the plasma above the substrate. On the other hand, in the negative phase period, the thickness of the sheath on the substrate is large, and the impedance between the substrate and the plasma is large. In the above embodiment, in order to increase the thickness of the sheath at the radial outer side of the edge of the substrate during the negative phase period and increase the impedance between the ring electrode and the plasma, the electrical bias energy generated by the second bias power source is supplied to the ring electrode. Therefore, the radio frequency power coupled to the plasma is suppressed above the ring electrode during the negative phase period. As a result, according to the above embodiment, the fluctuation of the spread of the plasma in the radial direction during the period of the electrical bias energy supplied to the bias electrode is suppressed.

[E2]

The plasma processing apparatus of [E1], wherein a phase of the electrical bias energy generated by the second bias power source is synchronized with a phase of the electrical bias energy generated by the first bias power source.

[E3]

The plasma processing apparatus of [E1] or [E2], wherein the electrical bias energy generated by each of the first bias power source and the second bias power source is radio frequency power having the bias frequency or a voltage pulse periodically generated at a time interval which is the reciprocal of the bias frequency.

[E4]

The plasma processing apparatus of any one of [E1] to [E3], wherein the first bias power source, the second bias power source, or another bias power source that generates electrical bias energy having the bias frequency is electrically coupled to the edge ring.

[E5]

A plasma processing apparatus comprising:

a chamber;

a substrate support provided in the chamber, configured to support a substrate mounted thereon and an edge ring mounted thereon to surround the substrate, and including a bias electrode;

a radio frequency power source configured to generate radio frequency power to generate plasma above the substrate support;

a ring electrode configured to extend at a radial outer side of the edge ring; and a bias power source configured to generate electrical bias energy having a bias frequency and electrically coupled to the bias electrode and the ring electrode to distribute the electrical bias energy to the bias electrode and the ring electrode.

In the above embodiment, the electrical bias energy from a single bias power source is distributed to the bias electrode of the substrate support and the ring electrode. Therefore, the phase of the electrical bias energy given to the bias electrode of the substrate support and the phase of the electrical bias energy given to the ring electrode are synchronized with each other. Therefore, the radio frequency power coupled to the plasma is suppressed above the ring electrode during the negative phase period. As a result, according to the above embodiment, the fluctuation of the spread of the plasma in the radial direction during the period of the electrical bias energy supplied to the bias electrode is suppressed.

[E6]

The plasma processing apparatus of [E5], wherein the electrical bias energy is radio frequency power having the bias frequency or a voltage pulse periodically generated at a time interval which is a reciprocal of the bias frequency.

[E7]

The plasma processing apparatus of [E5] or [E6], wherein the bias power source or another bias power source that generates electrical bias energy having the bias frequency is electrically coupled to the edge ring.

[E8]

The plasma processing apparatus of any one of [E1] to [E7], wherein the radio frequency power source is electrically connected to the bias electrode or another electrode provided in the substrate support and is configured to supply the radio frequency power to the bias electrode or the other electrode.

[E9]

The plasma processing apparatus of any one of [E1] to [E8], wherein the radio frequency power source or another radio frequency power source configured to generate radio frequency power to generate plasma above the substrate support is electrically coupled to the ring electrode.

[E10]

The plasma processing apparatus of any one of [E1] to [E9], wherein the ring electrode extends to surround the edge ring.

[E11]

A plasma processing method comprising:
(a) a step of mounting a substrate on a substrate support provided in a chamber of a plasma processing apparatus, the substrate support including a bias electrode and the substrate being disposed within a region surrounded by an edge ring disposed on the substrate support;
(b) a step of supplying radio frequency power to generate plasma above the substrate support;
(c) a step of supplying electrical bias energy from a first bias power source to the bias electrode; and
(d) a step of supplying electrical bias energy from a second bias power source to a ring electrode, the ring electrode extending at the radial outer side of the edge ring,
wherein the electrical bias energy generated by each of the first bias power source and the second bias power source has a bias frequency,
one cycle of the electrical bias energy generated by each of the first bias power source and the second bias power source includes a negative phase period having a time length that is a reciprocal of the bias frequency and having a voltage at which the electrical bias energy is lower than an average voltage thereof during the one cycle, and
the negative phase period of the electrical bias energy generated by the second bias power source at least partially overlaps the negative phase period of the electrical bias energy generated by the first bias power source.

[E12]

A plasma processing method comprising:
(a) a step of mounting a substrate on a substrate support provided in a chamber of a plasma processing apparatus, the substrate support including a bias electrode, and the substrate being disposed within a region surrounded by an edge ring disposed on the substrate support;
(b) a step of supplying radio frequency power to generate plasma above the substrate support;
(c) a step of supplying electrical bias energy to the bias electrode; and
(d) a step of supplying electrical bias energy to a ring electrode, the ring electrode extending at the radial outer side of the edge ring,
wherein, in the steps (c) and (d), the electrical bias energy generated by a single bias power source is distributed to the bias electrode and the ring electrode.

[F1]

A plasma processing apparatus comprising:
a plasma processing chamber;
a substrate support disposed in the plasma processing chamber and including a bias electrode;
an RF power source configured to generate RF power to generate plasma in the plasma processing chamber;
an edge ring disposed to surround a substrate on the substrate support;
a ring electrode disposed to surround the edge ring;
a first bias RF power source configured to supply a first bias RF power to the bias electrode, the first bias RF power having a first frequency and a first power level; and
a second bias RF power source configured to supply a second bias RF power to the ring electrode, the second bias RF power having the first frequency and a second power level and the second bias RF power being synchronized with the first bias RF power.

[F2]

The plasma processing apparatus of [F1], wherein the second power level is the same as the first power level.

[F3]

The plasma processing apparatus of [F1], wherein the second power level is different from the first power level.

[F4]

The plasma processing apparatus of [F3], wherein the second power level is greater than the first power level.

[F5]

The plasma processing apparatus of [F3], wherein the second power level is less than the first power level.

[F6]

The plasma processing apparatus of any one of [F1] to [F5], wherein a single bias RF power source serves as both the first bias RF power source and the second bias RF power source.

[F7]

A plasma processing apparatus comprising:
a plasma processing chamber;
a substrate support disposed in the plasma processing chamber and including a bias electrode;
an RF power source configured to generate RF power to generate plasma in the plasma processing chamber;
an edge ring disposed to surround a substrate on the substrate support;
a ring electrode disposed to surround the edge ring;
a first voltage pulse power source configured to apply a first voltage pulse signal to the bias electrode, the first voltage pulse signal having a first average voltage during a cyclic period, the first voltage pulse signal having a first voltage level lower than the first average voltage during a first period within the cyclic period and having a second voltage level higher than the first average voltage during a second period within the cyclic period; and
a second voltage pulse power source configured to apply a second voltage pulse signal to the ring electrode, the second voltage pulse signal having a second average voltage during the cyclic period, the second voltage pulse signal having a third voltage level lower than the second average voltage during the first period and having a fourth voltage level higher than the second average voltage during the second period, wherein an absolute value of the third voltage level is greater than an absolute value of the fourth voltage level.

[F8]

The plasma processing apparatus of [F7], wherein the first voltage level and the third voltage level have a negative polarity.

[F9]

The plasma processing apparatus of [F7] or [F8], wherein the third voltage level is the same as the first voltage level, and the fourth voltage level is the same as the second voltage level.

[F10]

The plasma processing apparatus of [F9], wherein a single voltage pulse power source serves as both the first voltage pulse power source and the second voltage pulse power source.

[F11]

The plasma processing apparatus of [F7] or [F8], wherein the third voltage level is different from the first voltage level.

[F12]

The plasma processing apparatus of any one of [F7] to [F11], wherein the first period has the same length as the length of the second period.

[F13]

The plasma processing apparatus of any one of [F7] to [F11], wherein the first period has a length different from the length of the second period.

[F14]

The plasma processing apparatus of any one of [F7] to [F11], wherein the first period has a length longer than the length of the second period.

[F15]

The plasma processing apparatus of any one of [F7] to [F11], wherein the first period has a length shorter than the length of the second period.

[F16]

A plasma processing apparatus comprising:
a plasma processing chamber;
a substrate support disposed in the plasma processing chamber and including a bias electrode;
an RF power source configured to generate RF power to generate plasma in the plasma processing chamber;
an edge ring disposed to surround a substrate on the substrate support;
a ring electrode disposed to surround the edge ring;
a first bias power source electrically connected to the bias electrode; and
a second bias power source electrically connected to the ring electrode,
wherein each of the first bias power source and the second bias power source is configured to generate electrical bias energy having a bias frequency,
one cycle of the electrical bias energy having a time length that is a reciprocal of the bias frequency includes a negative phase period in which the electrical bias energy has a voltage lower than an average voltage of the electrical bias energy during the one cycle, and
the negative phase period of the electrical bias energy generated by the second bias power source at least partially overlaps the negative phase period of the electrical bias energy generated by the first bias power source.

[F17]

The plasma processing apparatus of [F16], wherein a phase of the electrical bias energy generated by the second bias power source is synchronized with a phase of the electrical bias energy generated by the first bias power source.

[F18]

The plasma processing apparatus of [F16] or [F17], wherein the electrical bias energy generated by each of the first bias power source and the second bias power source is RF power having the bias frequency or a sequence of DC voltage pulses periodically generated at a time interval which is the reciprocal of the bias frequency.

[F19]

The plasma processing apparatus of any one of [F16] to [F18], wherein the first bias power source, the second bias power source, or an additional bias power source that generates the electrical bias energy having the bias frequency is electrically coupled to the edge ring.

Although various exemplary embodiments have been described above, various additions, omissions, substitutions, and changes may be made without being limited to the above-described exemplary embodiments. Further, it is possible to combine elements in different embodiments to form other embodiments.

From the above description, it is understood that the various embodiments of the present disclosure are described herein for purposes of explanation and that various modifications can be made without departing from the scope and gist of the present disclosure. Accordingly, the various embodiments disclosed herein are not intended to be limiting, and the true scope and gist is set forth by the appended claims.

The invention claimed is:

1. A plasma processing apparatus comprising:
a plasma processing chamber;
a substrate support disposed in the plasma processing chamber and including a bias electrode;
an RF power source configured to generate RF power to generate plasma in the plasma processing chamber;
an edge ring disposed to surround a substrate on the substrate support;
a ring electrode disposed to surround the edge ring;
circuitry;
a non-transitory computer-readable medium storing executable instructions;
a first bias RF power source configured to supply, when controlled by the circuitry executing the executable instructions, a first bias RF power to the bias electrode, the first bias RF power having a first frequency and a first power level; and
a second bias RF power source configured to supply, when controlled by the circuitry executing the executable instructions, a second bias RF power to the ring electrode, the second bias RF power having the first frequency and a second power level and the second bias RF power being synchronized with the first bias RF power.

2. The plasma processing apparatus of claim 1, wherein the second power level is the same as the first power level.

3. The plasma processing apparatus of claim 2, wherein a single bias RF power source serves as both the first bias RF power source and the second bias RF power source.

4. The plasma processing apparatus of claim 1, wherein the second power level is different from the first power level.

5. The plasma processing apparatus of claim 4, wherein the second power level is greater than the first power level.

6. The plasma processing apparatus of claim 4, wherein the second power level is less than the first power level.

7. The plasma processing apparatus of claim 1, wherein the ring electrode is made of Hastelloy, nickel, or silicon carbide.

* * * * *